(12) United States Patent
Karmous

(10) Patent No.: US 11,271,100 B2
(45) Date of Patent: Mar. 8, 2022

(54) NARROW SEMICONDUCTOR MESA DEVICE

(71) Applicant: Infineon Technologies Austria AG, Villach (AT)

(72) Inventor: Alim Karmous, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/653,283

(22) Filed: Oct. 15, 2019

(65) Prior Publication Data

US 2021/0111276 A1    Apr. 15, 2021

(51) Int. Cl.

| | |
|---|---|
| *H01L 29/739* | (2006.01) |
| *H01L 29/08* | (2006.01) |
| *H01L 29/423* | (2006.01) |
| *H01L 29/66* | (2006.01) |
| *H01L 29/10* | (2006.01) |
| *H01L 29/06* | (2006.01) |

(52) U.S. Cl.
CPC ...... *H01L 29/7397* (2013.01); *H01L 29/0696* (2013.01); *H01L 29/0804* (2013.01); *H01L 29/1095* (2013.01); *H01L 29/4236* (2013.01); *H01L 29/66348* (2013.01)

(58) Field of Classification Search
CPC ............ H01L 29/7397; H01L 29/0804; H01L 29/66348; H01L 29/4236; H01L 29/0696; H01L 29/1095; H01L 29/66325; H01L 29/66333; H01L 29/6634; H01L 29/7302; H01L 29/7393; H01L 29/7395; H01L 29/7396; H01L 2924/13055
See application file for complete search history.

(56) References Cited

U.S. PATENT DOCUMENTS

| | | | |
|---|---|---|---|
| 5,623,152 A | 4/1997 | Majumdar et al. | |
| 6,040,600 A * | 3/2000 | Uenishi | H01L 21/26546 257/330 |
| 6,184,555 B1* | 2/2001 | Tihanyi | H01L 29/0634 257/342 |
| 6,376,878 B1* | 4/2002 | Kocon | H01L 29/0634 257/328 |
| 6,452,230 B1* | 9/2002 | Boden, Jr. | H01L 29/405 257/341 |
| 6,566,691 B1 | 5/2003 | Inoue et al. | |

(Continued)

FOREIGN PATENT DOCUMENTS

| | | |
|---|---|---|
| DE | 102013112608 A1 | 6/2014 |
| DE | 102010036501 B4 | 3/2015 |

*Primary Examiner* — Eduardo A Rodela
(74) *Attorney, Agent, or Firm* — Murphy, Bilak & Homiller, PLLC

(57) ABSTRACT

First and second trenches are provided in a semiconductor body. A mesa dividing structure is provided between the first and second trenches and comprises non-semiconductor material. A first semiconductor mesa is provided between the first trench and the non-semiconductor material of the mesa dividing structure. The first semiconductor mesa includes emitter, body and drift regions. The first and second trenches are formed by a masked etching technique with a minimum trench separation distance, and the first semiconductor mesa is provided to have a lateral width that is less than the minimum trench separation distance.

10 Claims, 17 Drawing Sheets

(56) References Cited

U.S. PATENT DOCUMENTS

| | | | | |
|---|---|---|---|---|
| 7,345,342 B2* | 3/2008 | Challa | ............... | H01L 29/0634 257/341 |
| 7,902,071 B2* | 3/2011 | Marchant | ............ | H01L 29/7811 438/671 |
| 8,378,416 B2* | 2/2013 | Darwish | ............ | H01L 29/0696 257/329 |
| 8,410,551 B2* | 4/2013 | Parthasarathy | ..... | H01L 27/0211 257/340 |
| 8,552,493 B2* | 10/2013 | Parthasarathy | ....... | H01L 29/407 257/331 |
| 2002/0070418 A1* | 6/2002 | Kinzer | ............... | H01L 29/0634 257/496 |
| 2015/0091052 A1* | 4/2015 | Laven | ............... | H01L 29/4236 257/139 |

* cited by examiner

NARROW SEMICONDUCTOR MESA DEVICE

TECHNICAL FIELD

The instant application relates to semiconductor devices and particularly relates to techniques for forming narrow semiconductor regions for vertical semiconductor devices.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. In many of these applications, the semiconductor transistors must be designed to accommodate large currents and/or large voltages. For example, power semiconductor transistors are commonly required to control currents on the order of 1 A (amperes), 10 A, 100 A, 500 A, or more and/or to control voltages on the order of 20 V (volts), 100 V, 500 V, 1000 V or more.

Power consumption attributable to conduction and switching losses is an important performance parameter for power semiconductor transistors. In an IGBT, one way to improve power consumption is to increase the charge carrier density at the emitter/source side of the device. This enables easier removal of a larger proportion of charge carriers from the drift region of the device during turn-off. Current techniques for increasing the emitter/source side charge carrier density of power semiconductor transistors are reaching the practical limits of semiconductor processing technology.

SUMMARY

A semiconductor device is disclosed. According to an embodiment, the semiconductor device comprises a semiconductor body comprising a main surface and rear surface opposite the main surface, first and second trenches that are laterally separated from one another and each extend from the main surface into the substrate, a mesa dividing structure that is laterally between the first and second trenches and comprises non-semiconductor material, and a first semiconductor mesa between the first trench and the mesa dividing structure. The first semiconductor mesa comprises a first sidewall that is coextensive with a first sidewall of the first trench, a second sidewall that directly interfaces with the non-semiconductor material of the mesa dividing structure, a source region extending to the main surface and having a first conductivity type, a body region that is below the source region and has a second conductivity type opposite from the first conductivity type, and a drift region that is below body region and has the first conductivity type. An aspect ratio of the first semiconductor mesa defined by a lateral width of the first semiconductor mesa divided by a vertical depth of the first semiconductor mesa is less than or equal to 0.2.

Separately or in combination, a ratio between an aspect ratio of the first trench and the aspect ratio of the first semiconductor mesa is greater than or equal to 0.5, wherein the aspect ratio of the first trench equals a lateral width of the first trench divided by a vertical depth of the first trench.

Separately or in combination, the semiconductor device further comprises a carrier extraction region extending to the main surface and having the second conductivity type, the carrier extraction region is configured to provide a conduction path for second conductivity type carriers flowing from the rear surface to the main surface.

Separately or in combination, the semiconductor device comprises a second semiconductor mesa between the second trench and the mesa dividing structure, the second semiconductor mesa comprises a first sidewall that is coextensive with a first sidewall of the second trench, and a second sidewall that directly interfaces with the non-semiconductor material of the mesa dividing structure, and the carrier extraction region is disposed in the second semiconductor mesa.

Separately or in combination, the mesa dividing structure comprises two monolithic insulating structures and a central semiconductor mesa laterally disposed between the two monolithic insulating structures, and the carrier extraction region is disposed in the in the central semiconductor mesa.

Separately or in combination, the mesa dividing structure comprises electrically insulating material and electrically conductive material, and the electrically conductive material is formed in a central region of the mesa dividing structure that is insulated from the semiconductor body by the electrically insulating material.

Separately or in combination, the mesa dividing structure comprises a central trench and two monolithic insulating structures disposed on either side of the central trench, the electrically conductive material comprises a polysilicon region disposed in the central trench, the semiconductor device includes an emitter metallization, the emitter metallization is electrically connected to the source region and the carrier extraction region, and the body region is electrically disconnected from the emitter metallization.

Separately or in combination, the semiconductor device comprises a secondary trench disposed between the first and second trenches, and the mesa dividing structure comprises a monolithic insulating structure that completely occupies a lateral region between the first semiconductor mesa and the secondary trench.

Separately or in combination, the mesa dividing structure comprises a monolithic insulating structure, the semiconductor device further comprises a contact trench formed in the monolithic insulating structure, and an electrically conductive emitter contact filling the contact trench, and a sidewall of the emitter contact directly interfaces with the emitter and body regions.

A method of producing a semiconductor device is disclosed. According to an embodiment, the method comprises providing a semiconductor body comprising a main surface and rear surface opposite the main surface, providing first and second trenches that are laterally separated from one another and each extend from the main surface into the substrate, providing a mesa dividing structure that is laterally between the first and second trenches and comprises non-semiconductor material, and providing a first semiconductor mesa between the first trench and the mesa dividing structure. The first semiconductor mesa comprises a first sidewall that is coextensive with a first sidewall of the first trench, a second sidewall that directly interfaces with the non-semiconductor material of the mesa dividing structure, a source region extending to the main surface and having a first conductivity type, a body region that is below the source region and has a second conductivity type opposite from the first conductivity type, and a drift region that is below body region and has the first conductivity type. The first and second trenches are formed by a masked etching technique with a minimum trench separation distance, and the first semiconductor mesa is provided to have a lateral width that is less than the minimum trench separation distance, the lateral width of the first semiconductor mesa being a shortest distance between the first and second sidewalls of the first semiconductor mesa.

Separately or in combination, the first and second trenches are formed with a lateral separation distance that is greater than the minimum trench separation distance, and providing the mesa dividing structure comprises forming at least one central trench that is between the first and second trenches and is laterally separated from the first trench by a distance that is equal to or greater than the minimum trench separation distance, performing an insulator growth process that fills the central trench with insulator material and consumes semiconductor material, and controlling parameters of the insulator growth process so that the insulator material consumes semiconductor material between the trench and the first trench to the point wherein the first semiconductor mesa is narrower than the minimum trench separation distance.

Separately or in combination, providing the mesa dividing structure comprises forming a plurality of the central trenches between the first and second trenches, each of the central trenches having a width that is less than widths of the first and second trenches, and performing the insulator growth process such that each of the central trenches is completely filled with the insulator material.

Separately or in combination, the plurality of the central trenches are formed to be separated from one another by intermediary semiconductor mesas, and the insulator growth process is performed such that each of the intermediary semiconductor mesas is completely consumed by the insulator material so as to form a monolithic insulating structure from the plurality of the central trenches.

Separately or in combination, the method further comprises forming a secondary trench disposed between the first and second trenches, and the monolithic insulating structure is formed to completely occupy a lateral region between the first semiconductor mesa and the secondary trench.

Separately or in combination, the method further comprises forming a first gate electrode in the first gate trench, a second gate electrode in the second gate trench, and a conductive region in the secondary trench, forming the first and second gate electrodes and the conductive region comprises depositing a first doped polysilicon layer that fills the first and second gate trenches and the secondary trench simultaneously with doped polysilicon, removing the doped polysilicon from the secondary trench, depositing a second undoped polysilicon layer in the secondary trench after removing the doped polysilicon from the secondary trench, and planarizing the substrate so as to remove portions of the first and second polysilicon layers above the first and second gate trenches and the secondary trench.

Separately or in combination, the method further comprises forming a contact trench in the monolithic insulating structure, and filing the contact trench with an electrically conductive material thereby forming an emitter contact, and a sidewall of the emitter contact directly interfaces with the emitter and body regions.

Separately or in combination, the mesa dividing structure is provided to include two of the monolithic insulating structures and a central semiconductor mesa laterally disposed between the two monolithic insulating structures, and providing the mesa dividing structure comprises providing a first plurality of the central trenches, each of the central trenches in the first plurality are formed to be separated from one another by the intermediary semiconductor mesas, providing a second plurality of the central trenches, each of the central trenches in the second plurality are formed to be separated from one another by the intermediary semiconductor mesas, providing a permanent semiconductor mesa between the first and second pluralities, the permanent semiconductor mesa being wider than the intermediary semiconductor mesas, and performing the insulator growth process such that each of the intermediary semiconductor mesas is completely consumed by the insulator material and such that the permanent semiconductor mesa remains intact after the insulator growth process.

Separately or in combination, the first and second trenches and the plurality of the central trenches are formed simultaneously by the masked etching technique with the minimum trench separation distance.

Separately or in combination, the first and second trenches are formed by a first masked etching step, the plurality of the central trenches are formed by a second masked etching step that is performed before or after the first masked etching step, and a bottom of at least one of the central trenches in the plurality is disposed at a different distance from the main surface than bottoms of both of the first and second trenches.

Separately or in combination, the first semiconductor mesa is provided such that an aspect ratio of the first semiconductor mesa is less than or equal to 0.2, the aspect ratio of the first semiconductor mesa is a lateral width of the first semiconductor mesa divided by a vertical depth of the first semiconductor mesa.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a vertical IGBT having a source region disposed in a semiconductor mesa with an advantageously low aspect ratio (i.e., the ratio of width to depth of the semiconductor mesa) are described herein. The vertical IGBT includes two trenched gate electrodes that are laterally separated from one another. A mesa dividing structure is provided between the two trenched gate electrodes. The mesa dividing structure includes non-semiconductive materials, which may include insulators and conductors. The mesa dividing structure defines at least a first semiconductor mesa adjacent to a first gate trench. A first sidewall of the first semiconductor mesa directly interfaces with the first gate trench and a second sidewall of the first semiconductor mesa directly interfaces with the non-semiconductive material of the mesa dividing structure. The emitter and body regions of the vertical IGBT are provided in the first semiconductor mesa. Due to the advantageous techniques described herein, the first semiconductor mesa can be formed with a low aspect ratio while maintaining deep and wide gate trenches. By making the semiconductor mesa through which the charge carriers of a first type are extracted from the drift region to be narrow, the concentration of the charge carriers of the first type in the emitter side of the device is increased. This in turn induces an increase in the concentration of the charge carriers of the opposite type (i.e., the second type) because of charge neutrality principles. This increased emitter side charge carrier density results in low on state voltage drop and low switching off losses since, at turn off of the device, most of the charge carrier are removed at low voltages.

Figure 1:
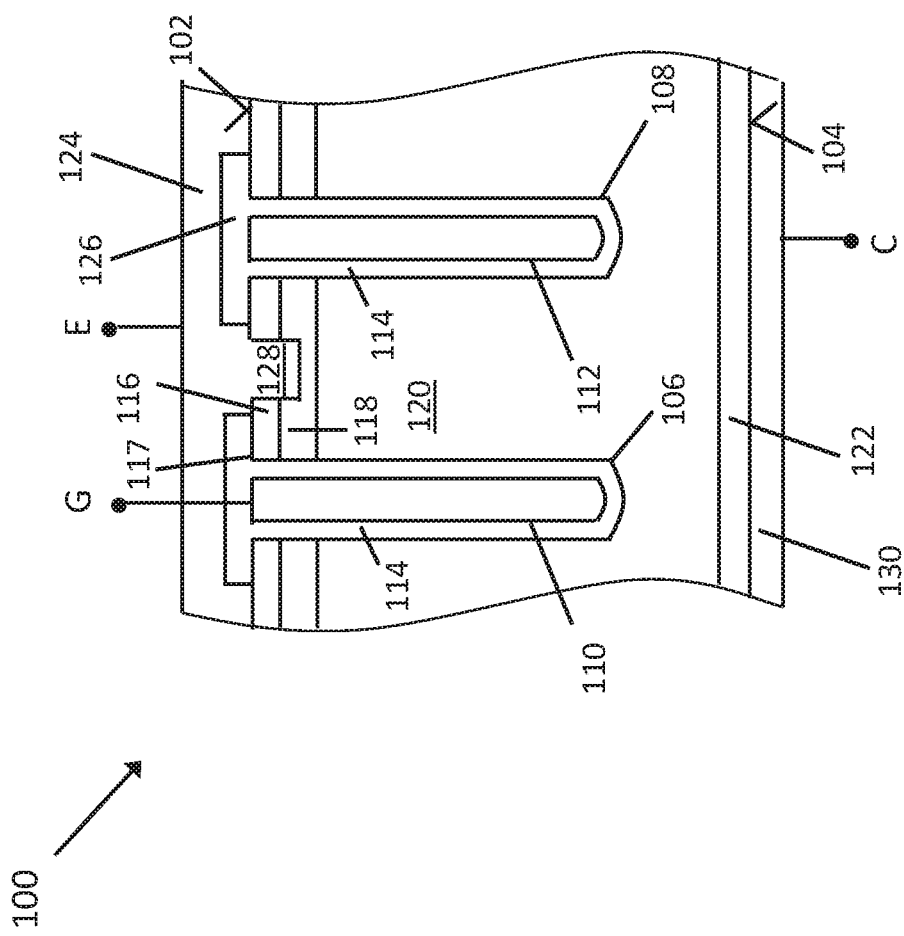
FIG. 1 illustrates a vertical insulated gate bipolar transistor, according to an embodiment.

Referring to FIG. 1, a cross-sectional view of a vertical insulated gate bipolar transistor (IGBT) 100 is depicted, according to an embodiment. The vertical IGBT 100 is formed in a semiconductor body having a main surface 102 and rear surface 104 opposite the main surface 102. The vertical IGBT 100 includes first and second gate trenches 106, 108 that are laterally separated from one another. Each of the first and second gate trenches 106, 108 extend from the main surface 102 into the semiconductor body. First and second gate electrodes 110, 112 are respectively provided in the first and second gate trenches 106, 108. The first and second gate electrodes 110, 112 are formed from an electrically conductive material, e.g., metal or highly doped polysilicon. The first and second gate electrodes 110, 112 are each insulated from the semiconductor body by a gate dielectric 114 of electrically insulating material, e.g., silicon dioxide ($SiO_2$), silicon nitride (SiN), etc.

The vertical IGBT 100 includes a source region 116, a body region 118, a drift region 120, and a collector region 122. The source and drift regions 116, 120 are n-type semiconductor regions, wherein the drift region has a lower relative dopant concentration. The body and collector regions 118, 122 are p-type semiconductor regions. The source region 116 extends to the main surface 102 and directly adjoins the first and second gate trenches 106, 108. The body region 118 forms a first p-n junction with the source region 116 below the main surface 102 and directly adjoins the first and second gate trenches 106, 108. The drift region 120 forms a second p-n junction with the body region 118 below the main surface 102 and extends below the first and second gate trenches 106, 108. At the rear side of the device, the drift region 120 forms a third p-n junction with the collector region 122. An electrically conductive emitter metallization 124 is disposed on the main surface 102. The emitter metallization 124 is insulated from the first and second gate electrodes 110, 112 by a passivation layer 126, which includes one or more layers of electrically insulating material, e.g., $SiO_2$, SiN, etc. A low ohmic connection between the emitter metallization 124 and the emitter and body regions 116, 118 may be provided by an emitter contact 128, which may be a plug formed from a conductive metal such as tungsten. An electrically conductive collector metallization 130 is disposed on the rear surface 104. The collector metallization 130 may form low ohmic connection with the collector region 122 via direct contact. In other embodiments, additional doped regions may be provided. For example, highly doped regions of either conductivity type may be provided to act as field stop at the rear side of the device and/or barrier regions.

The operating principle of the vertical IGBT 100 is as follows. When a gate-emitter voltage in excess of a threshold voltage is applied to the first and second gate electrodes 110, 112, a conductive electron channel forms in the body region 118 in the immediate vicinity of the first and second gate trenches 106, 108. Under positive emitter-collector bias, electrons are injected from the source region 116 through the body region 118 and into the drift region 120. At the rear side of the device, the p-n junction between the collector region 122 and the drift region is forward biased and thus injects holes into the drift region 120. A vertical IGBT 100 that works under the same operating principle except with opposite carrier type currents may be obtained by reversing the conductivity types of the source region 116, the body region 118, the drift region 120, and the collector region 122.

An important performance related parameter of the vertical IGBT 100 is the emitter side charge carrier density profile. The emitter side charge carrier density profile is the profile of the number of carriers (holes and electrons) per unit volume in the drift region below the body region in the semiconductor mesa between the first and second trenches 106, 108 and extending to below the trenches. An increased emitter side charge carrier density lowers the on-state voltage drop $V_{CEON}$ of the device. An increased emitter side charge carrier density also facilitates easier removal of charge carriers from the drift region 120 during a turn-off operation of the device. Consequently, the power consumption of the device attributable to switching is beneficially reduced.

One way to increase emitter side charge carrier density of the vertical IGBT 100 is through geometric modification. Decreasing the aspect ratio of the semiconductor mesa 117 between the first and second gate trenches 106, 108, i.e., the ratio of the width of the semiconductor mesa 117 to the depth of the semiconductor mesa 117, reduces the volume of the region through which holes are extracted from the drift region 120. However, in the device of FIG. 1, the ability to do so is limited by the process technology used to form the device. Specifically, the width of the semiconductor mesa 117 between the first and second gate trenches 106, 108 cannot be reduced below the minimum separation distance associated with the technique used to form the first and second gate trenches 106, 108. Moreover, the ability to reduce the width of the semiconductor mesa 117 between the first and second gate trenches 106, 108 is constrained by the area requirements for the emitter contact 128. At low widths, it becomes difficult or impossible to reliably form the emitter contact 128 with sufficient current carrying capability.

Figure 2:
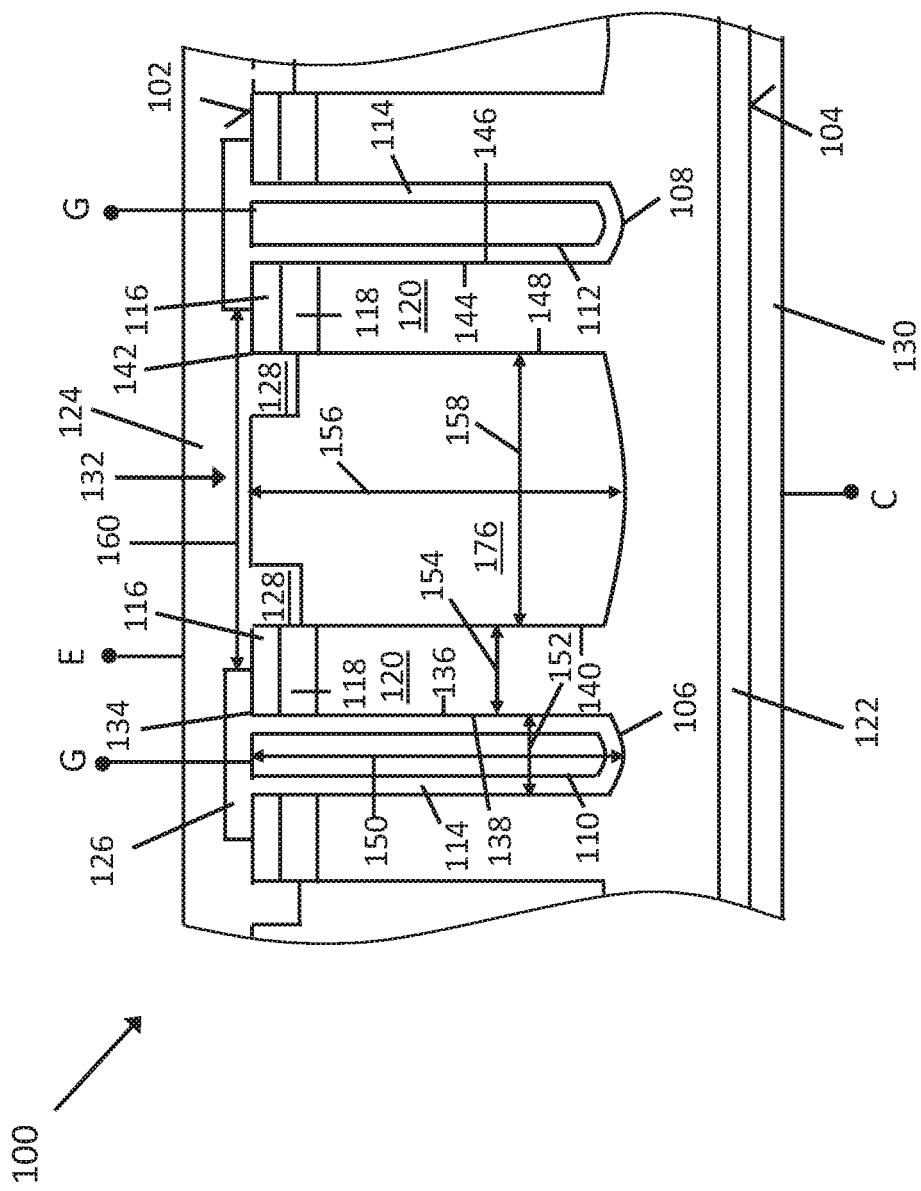
FIG. 2 illustrates a vertical insulated gate bipolar transistor with a mesa dividing structure, according to an embodiment.

Referring to FIG. 2, a cross-sectional view of a vertical IGBT 100 is depicted, according to another embodiment. Different to vertical IGBT 100 of FIG. 1, the embodiment of FIG. 2 includes a mesa dividing structure 132 between the first and second gate trenches 106, 108. This arrangement may represent one transistor cell, wherein the depicted pattern is successively repeated multiple times in the semiconductor body. The mesa dividing structure 132 includes non-semiconductive material. Generally speaking, this non-semiconductive material may include any of a wide variety of electrical insulators, e.g., oxides, nitrides, etc., and electrical conductors, e.g., metals such as copper, tungsten, aluminum, or highly doped polysilicon.

The mesa dividing structure 132 defines a first semiconductor mesa 134 in the semiconductor body that is between the mesa dividing structure 132 and the first gate trench 106. The first semiconductor mesa 134 has a first sidewall 136 that is coextensive with a first sidewall 138 of the first gate trench 106 and a second sidewall 140 that directly interfaces with the non-semiconductive material of the mesa dividing structure 132. In this embodiment, the mesa dividing structure 132 additionally defines a second semiconductor mesa 142 that is between the mesa dividing structure 132 and the second gate trench 106. The second semiconductor mesa 142 has a first sidewall 144 that is coextensive with a first sidewall 146 of the second gate trench 108 and a second sidewall 148 that directly interfaces with the non-semiconductive material of the mesa dividing structure 132.

According to an embodiment, the mesa dividing structure 132 consists solely of a monolithic insulating structure 176. A monolithic insulating structure 176 is a region of one type of insulator material that extends from the main surface 102 and includes opposing outer sidewalls which face the first and second gate trenches 106, 108. More generally, the mesa dividing structure 132 may include multiple electrically insulating materials combined with one another and/or may include multiple monolithic insulating structures combined with conducive regions. In any case, the interfacing sidewalls of the mesa dividing structure 132 include an insulating material that confines carriers to the first and second semiconductor mesas 134, 142.

The first and second semiconductor mesas 134, 142 each include a source region 116 extending to the main surface 102 and having a first conductivity type (e.g., n-type), a body region 118 that is below the source region 116 and has a second conductivity type opposite from the first conductivity type (e.g., p-type), and a drift region 120 that is below the body region 118 and has the first conductivity type (e.g., n-type). The first and second gate electrodes 110, 112 are configured to control a conductive current flowing through the first and second semiconductor mesas 134, 142, respectively, by controlling a conductive channel in each body region 118 according to the operating principle described above with reference to FIG. 1.

Various dimensions of the vertical IGBT 100 will now be described. For the sake of brevity, only the dimensions of the first gate trench 106 and the first semiconductor mesa 134 are described. These dimensions are also applicable to the second gate trench 108 and the second semiconductor mesa 142. The dimensions of the first gate trench 106 and the first semiconductor mesa 134 can be, but are not necessarily, the same as the dimensions as the second gate trench 108 and the second semiconductor mesa 142, respectively.

According to an embodiment, the vertical depth 150 of first gate trench 106 is between 2 μm (microns) and 10 μm. In a specific example, the vertical depth 150 is about 4 μm. The vertical depth 150 of the first gate trench 106 is a shortest distance between the main surface 102 and the bottom of the first gate trench 150.

According to an embodiment, the width 152 of the first gate trench 108 is between 500 nm (nanometers) and 2.0 μm. In a specific example, the width 152 of the first gate trench 108 is about 800 nm. The width 152 of the first gate trench 108 is a shortest distance between the first sidewall 138 and a second sidewall that is opposite the first sidewall 138.

According to an embodiment, the width 154 of the first semiconductor mesa 134 is between 5 nm and 800 nm. In a specific example, the width 154 is about 400 nm. The width 154 of the first semiconductor mesa 134 is a shortest distance between the first and second sidewalls 136, 140 of the first semiconductor mesa 134.

According to an embodiment, the vertical depth 156 of the mesa dividing structure 132 is between 2 μm (microns) and 10 μm. In a specific example, the vertical depth 156 of the mesa dividing structure 132 is about 4 μm. The vertical depth 156 of the mesa dividing structure 132 is a shortest distance between the main surface 102 and the bottom of the mesa dividing structure 132.

According to an embodiment, the width 158 of the mesa dividing structure 132 is between 300 nm and 2 μm. In a specific example, the width 158 is about 1450 nm. The width of the mesa dividing structure 132 is a shortest distance between the second sidewall 140 of the first semiconductor mesa 134 and the second sidewall 148 of the second semiconductor mesa 142.

According to an embodiment, the width 160 of the opening in the passivation layer 126 that is directly over the source and body regions 116, 118 is between 300 nm and 3 μm. In a specific example, the width 160 is about 2 μm. The width 160 of the opening in the passivation layer 126 is a shortest distance between edge sides of the passivation layer 126 that are directly over the first and second semiconductor mesas 134, 142.

According to an embodiment, an aspect ratio of the first semiconductor mesa 134 is less than or equal to 0.2. The aspect ratio of the first semiconductor mesa 134 is the lateral width 154 of the first semiconductor mesa 134 divided by a vertical depth of the first semiconductor mesa 134. The vertical depth of the first semiconductor mesa 134 is the longer of the vertical depth 156 of the mesa dividing structure 132 or the vertical depth 150 of first gate trench 106.

According to an embodiment, a ratio between the aspect ratio of the first gate trench 106 and the aspect ratio of the first semiconductor mesa 134 is greater than or equal to 0.5. The aspect ratio of the first gate trench 106 equals the width 152 of the first gate trench 106 divided by the vertical depth 150 of the first gate trench 106. The ratio between the aspect ratio of the first gate trench 150 and the aspect ratio of the first semiconductor mesa 134 equals the aspect ratio of the first gate trench 150 divided by the aspect ratio of the first semiconductor mesa 134. Hence, in an embodiment wherein the first semiconductor mesa 134 has an aspect ratio of less than or equal to 0.2, the 0.5 ratio requirement is met if an aspect ratio of the gate trench is greater than or equal to 0.1.

Accordingly, the benefits of a low aspect ratio semiconductor mesa with respect to emitter side charge carrier density as described above are achieved while maintaining relatively deep and/or wide gate trenches. Thus, other considerations related to the geometry of the gate structure, e.g., transconductance, are not sacrificed by forming the narrow width source region. Meanwhile, the width 160 of the opening in the passivation layer 126 remains advantageously large, e.g., between about 300 nm and 3 µm, or in relational terms at least two times the width 152 of the first gate trench 150. Accordingly, the emitter contact 128 may be easily and reliably formed between the first and second gate trenches 106, 108.

The advantageous geometric properties as discussed above are made possible by advantageous techniques relating to the formation of the mesa dividing structure 132. As will be described in further detail below, by intentionally forming the first and second gate trenches 106, 108 to be spaced apart from one another by a large distance (e.g., at least three times the minimum trench separation distance) and providing the mesa dividing structure 132 in between, it is possible to reliably form the first and second semiconductor mesas 134, 142 to be narrower than the minimum trench separation distance.

Figure 3:
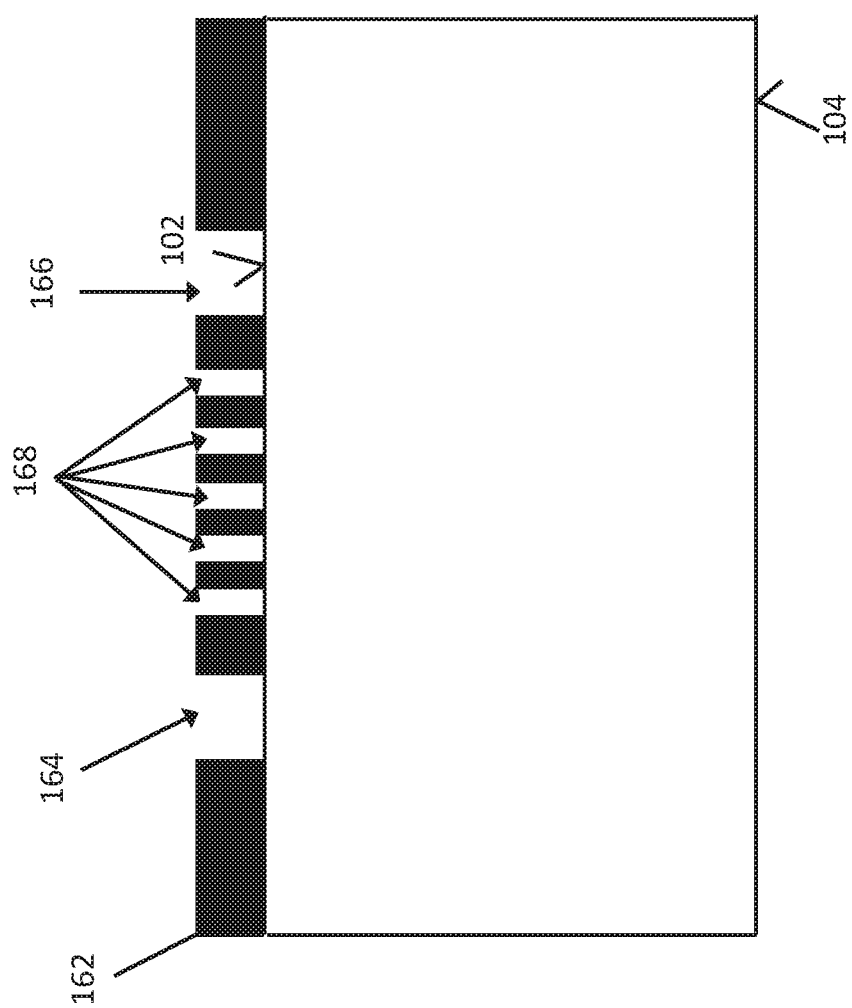
FIGS. 3-8 illustrate selected process steps for forming a vertical insulated gate bipolar transistor with a mesa dividing structure, according to an embodiment.

In FIG. 3, a masking step for forming a semiconductor device with a mesa dividing structure 132 is depicted, according to an embodiment. According to this technique, a semiconductor body that includes a main surface 102 and rear surface 104 opposite the main surface 102 is provided. Generally speaking, the semiconductor body can include a wide variety of semiconductor materials including compound group IV semiconductor materials such as silicon, silicon carbide (SiC) or silicon germanium (SiGe) and group III-V semiconductor materials such as gallium nitride (GaN), gallium arsenide (GaAs), etc. The semiconductor body may include a commercially available bulk semiconductor wafer, such as a silicon wafer, which extends to the rear surface 104, and a region of epitaxial material that extends to the main surface 102. This region of epitaxial material may have an intrinsic doping concentration (e.g., n-type) which provides the drift region doping concentration.

An etch-resistant mask 162 is formed on the main surface 102 of the semiconductor body. Generally speaking, the material of the etch-resistant mask 162 can be any material that can effectively prohibit etchants (e.g., wet chemical etchants or plasma) from penetrating the semiconductor body. The etch-resistant mask 162 may be formed from a hardmask material such as carbon, carbon-containing material (e.g., diamond-like-carbon (DLC), semiconductor oxides and nitrides, e.g., silicon nitride (SiN), silicon dioxide ($SiO_2$), etc. Alternatively, the etch-resistant mask 162 may be formed from photoresist materials, such as photopolymeric photoresist, photodecomposing photoresist and photocrosslinking photoresist, etc.

The etch-resistant mask 162 is patterned to include openings that expose portions of the main surface 102. These openings include first and second wider openings 164, 166 and a plurality of narrower central openings 168 between the wider openings 164, 166. The width of the first and second wider openings 164, 166 is selected to be greater than the width of the narrower central openings 168. Moreover, the distance between immediately adjacent narrower central openings 168 is selected to be less than the distance between one of the wider openings 164, 166 and the closest narrower central opening 168. In relational terms, the width of the first and second wider openings 164, 166 may be at least two times greater than the width of the narrower central openings 168, and the separation distance between immediately adjacent narrower central openings 168 may be no more than one half of the separation distance between one of the first and second wider openings 164, 166 and the closest narrower central opening 168. In a numerical example, the width of the first and second wider openings 164, 166 may be in the range of 500-700 nm, the width of the narrower central openings 168 may be in the range of 100-200 nm, the separation distance between immediately adjacent narrower central openings 168 may be in the range of 100-200 nm, and the separation distance between one of the first and second wider openings 164, 166 and the closest narrower central opening 168 may be in the range of 200-400 nm.

Figure 4:
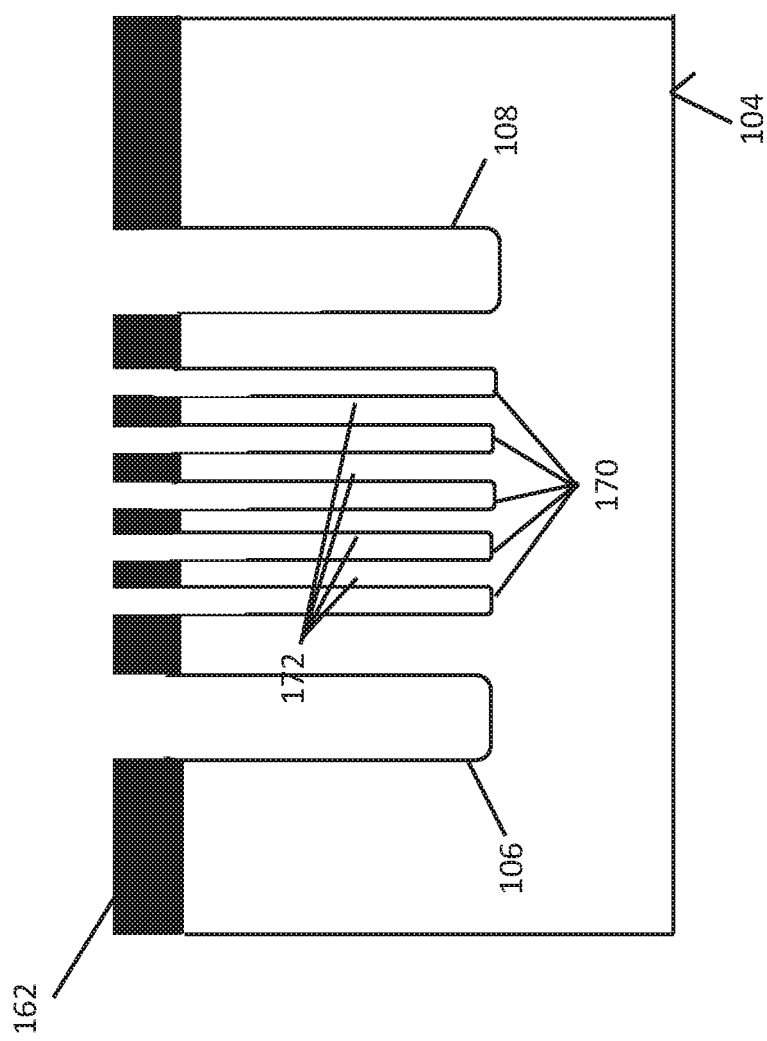

Referring to FIG. 4, an etching step is performed. In a commonly known manner, the etching step removes semiconductor material from exposed regions of the semiconductor body. Generally speaking, this may be performed according a variety of etching techniques, e.g., wet chemical etching techniques, dry etching techniques such as deep reactive ion etching, etc. As a result of the etching step, the first and second gate trenches 106, 108 are formed. Additionally, a plurality of narrow central trenches 170 are formed between the first and second gate trenches 106, 108. Each of the narrow central trenches 170 in the plurality are separated from one another by intermediary semiconductor mesas 172. The width of these features is correlated to the chosen dimensions of the etch-resistant mask 162 as described above.

Figure 5:
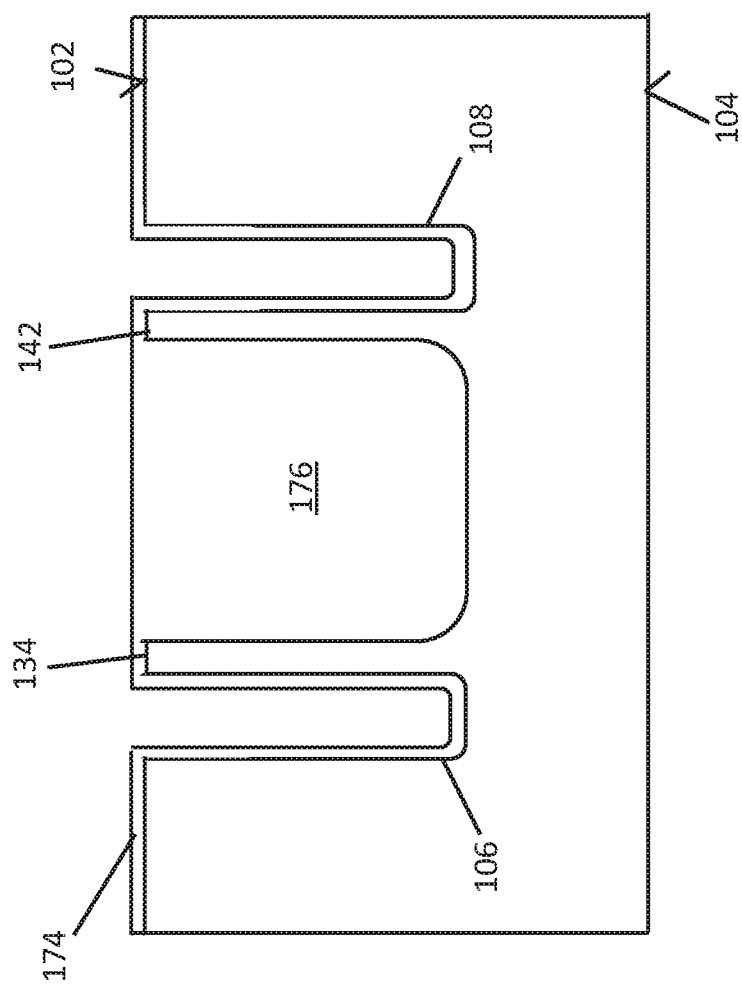

Referring to FIG. 5, the etch-resistant mask 162 is removed, e.g., using known techniques. Subsequently, an insulator layer 174 is grown on exposed surfaces of the semiconductor body. The insulator layer 174 may be grown using thermal oxidation or thermal nitridation techniques, wherein the surfaces of the semiconductor body are exposed to a reactive agent (e.g., oxygen or nitrogen) at elevated temperatures, e.g., between about 800 and 1200° C. The formed insulator layer may include an oxide, a nitride, or an oxynitride, e.g., silicon nitride ($Si_3N_4$), silicon dioxide ($SiO_2$), or silicon oxynitride ($SiO_xN_y$) in the case of a silicon semiconductor body.

The insulator growth process is performed such that the narrow central trenches 170 are completely filled by the insulator layer 174. Moreover, the insulator layer 174 completely consumes the intermediary semiconductor mesas 172. Insulator formation techniques such as thermal oxidation or thermal nitridation form an insulation layer that grows upward while simultaneously consuming semiconductor material downward according to a known proportional relationship, e.g., 2:1 upward:downward. The parameters of the insulator growth process (e.g., time and temperature) may be selected to ensure that the formed insulator layer 174 has a thickness equal to at least one half of the width of the narrow central trenches 170, thereby ensuring that these trenches become fully filled. Moreover, the parameters of the insulator growth process may be selected to ensure that the formed insulator layer 174 expands across an entire width of the intermediary semiconductor mesas 172. Meanwhile, because the first and second gate trenches 106, 108 are substantially wider than the narrow central trenches 170, the formed insulator layer 174 does not completely fill the first and second gate trenches 106, 108.

As a result of the insulator growth process, the first and second semiconductor mesas 134, 142 are formed with a monolithic insulating structure 176 provided between them. Advantageously, the above described technique can form the first and second semiconductor mesas 134, 142 with lateral widths that are below a minimum trench separation distance between the first and second gate trenches 106, 108, which is dependent on a number of processing step including the masked etching technique described with reference to FIGS.

3-5. As a result, the aspect ratios of the first and second semiconductor mesas 134, 142 are advantageously lower than the aspect ratio of a semiconductor mesa that is directly between two gate trenches. This is attributable to the fact that the insulator formation process described in FIG. 5 is an independent process from the trench formation process and is highly controllable. Specifically, the consumption rate of the insulator material is highly controllable and predictable through known relationships between time and temperature. Moreover, due to their smaller size, there is less variation in the width of the narrow central trenches 170 than the width of the first and second gate trenches 106, 108. Hence, the beginning point of insulator growth is highly predictable, and the endpoint of the insulator material that consumes the semiconductor material is highly controllable.

Applying the above concept, according to an embodiment, the process parameters of the etching and insulator growth steps described with reference to FIGS. 3-5 are controlled such that a width of one or both of the first and second semiconductor mesas 134, 142 is below the minimum trench separation distance used to form the first and second gate trenches 106, 108. In this embodiment, the lateral separation distance between the first and second gate trenches 106, 108 is selected to be greater than the minimum trench separation distance, e.g., at least three times the minimum trench separation distance. Using the first semiconductor mesa 134 as an example, the lateral separation distance between the first gate trench 150 and the nearest narrow central trench 170 is selected to be equal to or slightly greater than the minimum trench separation distance, e.g., no more than 125% of the minimum trench separation distance. The parameters of the insulator growth process (e.g., time and temperature) are controlled so that the insulator material consumes semiconductor material to the point wherein the first semiconductor mesa 134 is narrower than the minimum trench separation distance.

Figure 6:
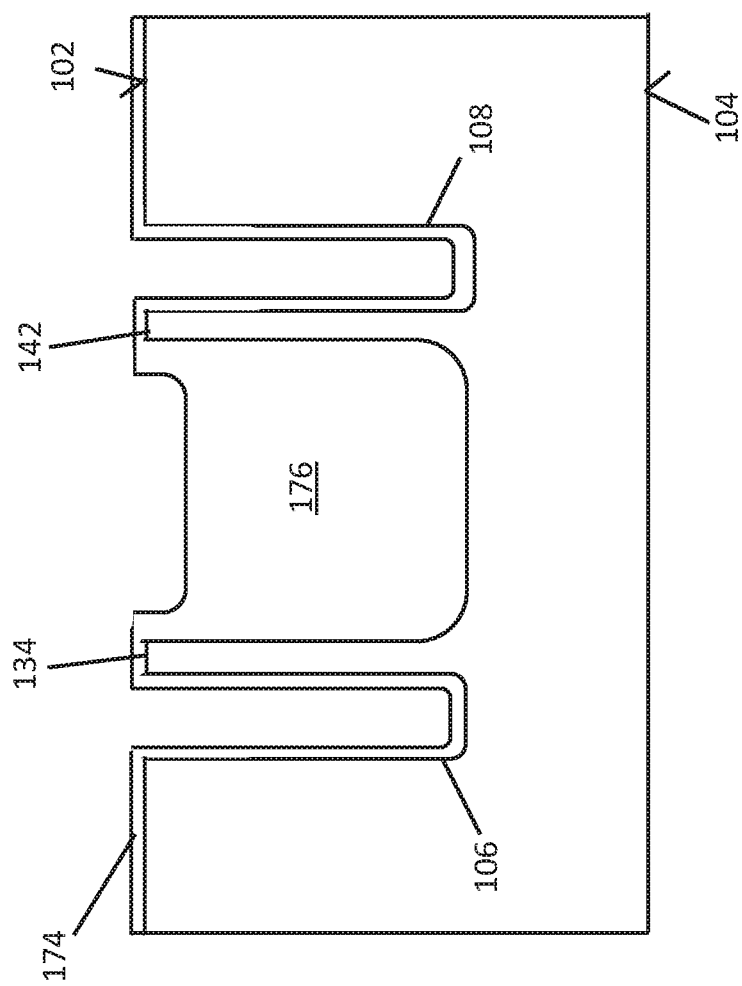

Referring to FIG. 6, the insulator layer 174 is removed. This may be done using wet or dry etching techniques, for example. The technique is carried out such that the formed insulator layer 174 is completely removed from the first and second gate trenches 106, 108. Additionally, a small thickness of the insulator material is removed from an upper side of the monolithic insulating structure 176. However, the majority of the monolithic insulating structure 176 remains intact.

Figure 7:
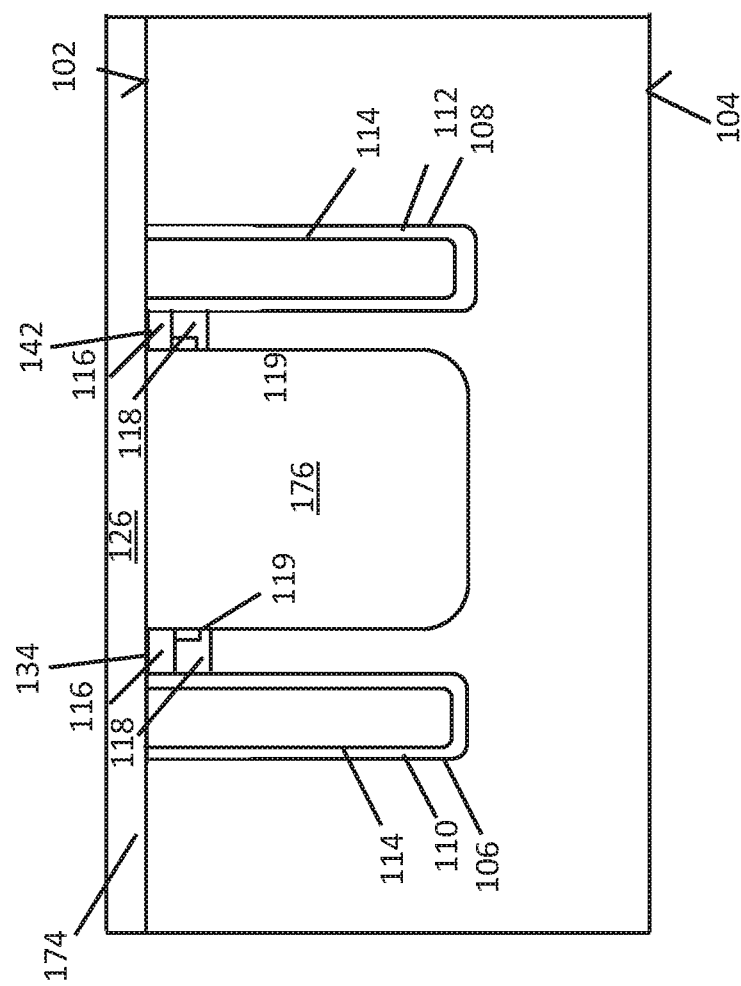

Referring to FIG. 7, several processing steps are performed to form various features of the vertical IGBT. These processing steps include the formation of the gate dielectric 114 in the first and second gate trenches 106, 108. The gate dielectric 114 may be formed by depositing a layer of insulating material that lines sidewalls the first and second gate trenches 106, 108 using techniques such as vapour phase deposition, thermal oxidation, etc. The formed gate dielectric 114 may include an oxide, a nitride, or an oxynitride, e.g., silicon nitride (SiN), silicon dioxide ($SiO_2$), or silicon oxynitride ($SiO_xN_y$) in the case of a silicon semiconductor body. A planarization or polishing technique (e.g., CMP) may be performed to remove the deposited layer of insulating material from the main surface 102.

After forming the gate dielectric 114, the first and second gate electrodes 110, 112 may be formed. This may be done by depositing electrically conductive material (e.g., polysilicon) or a conductive metal (e.g., aluminum or tungsten) that fills the first and second gate trenches 106, 108. A planarization or polishing technique (e.g., CMP) may be performed to remove the deposited layer of conductive material from the main surface 102.

The source and body regions 116, 118 are formed in the first and second semiconductor mesas 134, 142. Optionally, a highly doped body contact region 119 may be formed locally in the body region 118. The highly doped body contact region 119 may be a second conductivity type region with a higher dopant concentration as the body region 118, thereby providing low-ohmic contact to the emitter contact 128. These regions may be formed using known doping techniques, e.g., implantation or diffusion. This doping process may be performed after forming the monolithic insulating structure 176. In one example, the monolithic insulating structure 176 is partially etched to expose sidewall surfaces of the first and second semiconductor mesas 134, 142. Subsequently, dopants are implanted by an angled implantation technique into the exposed sidewall portions of the first and second semiconductor mesas 134, 142 and subsequently activated. Alternatively, at least some of the above described doped regions may be formed before forming the monolithic insulating structure 176. In one example, a doped layer having the doping of the body region 118 is formed in the semiconductor body prior to the steps described in FIGS. 3-5, wherein an upper one of the doped layers provides the source region 116 and a lower one of the doped layers provides the body region 118.

After forming the gate structures and the active doped regions, the passivation layer 126 is formed on the main surface 102 of the semiconductor body and over the first and second gate trenches 106, 108. The passivation layer 126 may be formed using techniques such as vapour phase deposition, thermal oxidation, etc. The passivation layer 126 may be a multi-layer structure with different thickness and material types, e.g., with a thin layer of SiN and a thicker layer of $SiO_2$ in one example.

Figure 8:
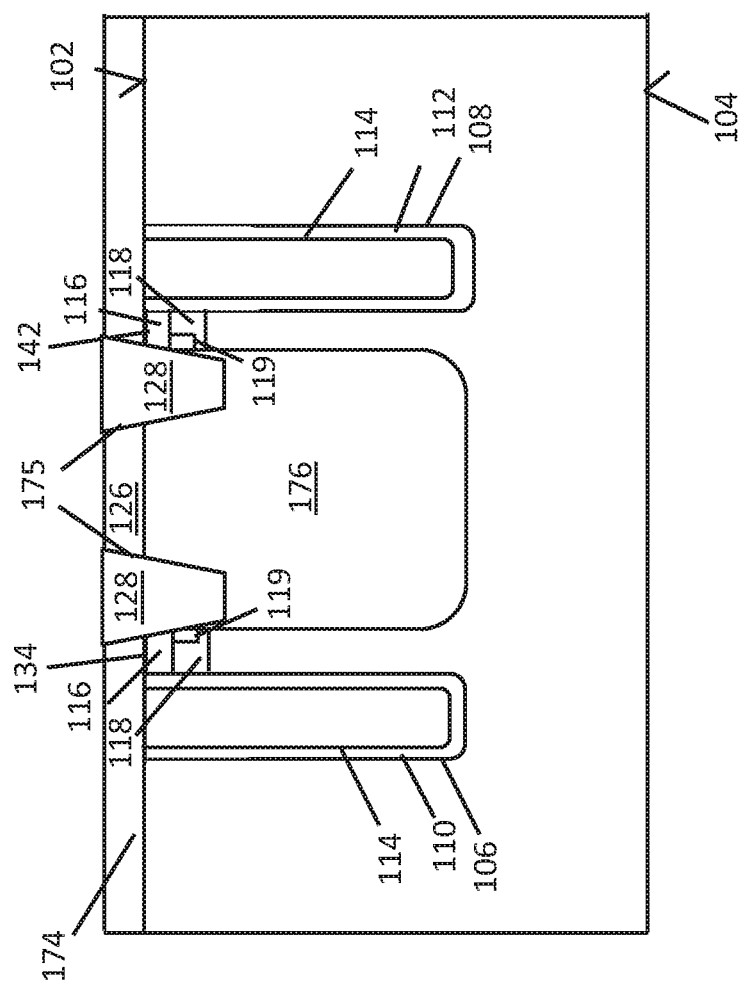

Referring to FIG. 8, emitter contact trenches 175 that penetrate the passivation layer 126 and extend into the monolithic insulating structure 176 are formed, e.g., using a masked etching technique. The sidewalls of the contact trenches 175 interface with the source and body regions 116, 118. In an embodiment, the highly doped body contact region 119 is formed by implanting dopants into the sidewalls of the emitter contact trenches. The contact trenches are filled with an electrically conductive material, e.g., tungsten, nickel, etc., thereby forming the emitter contacts 128. By forming the emitter contact 128 to contact both the source and body regions 116, 118, the device has improved carrier extraction capability, as first conductivity type carriers (e.g., electrons) are injected from the source regions 116 and second conductivity type carriers (e.g. holes) are extracted from the body regions 116. In another embodiment, instead of forming discrete emitter contacts, the emitter metallization layer 124 may be deposited directly in the opening of the passivation layer 126 that is over the source regions 116 so as to directly contact the source and body regions 116, 118.

In the technique described with reference to FIGS. 3-8, the first and second gate trenches 106, 108 and the narrow central trenches 170 are simultaneously formed by a single masked etching step. Hence, the depth of each of these trenches is correlated since they are formed by the same etching conditions. As a result, the bottom of the monolithic insulating structure 176 is close to the same depth (e.g., within 10%) as the depth of the first and second gate trenches 106, 108, with depth of the narrow central trenches 170 and hence the depth of the monolithic insulating structure typically being slightly shallower than the first and second gate trenches 106, 108. Alternatively, the first and second gate trenches 106, 108 may be formed by a first masked etching step, and the narrow central trenches 170 are formed by a second masked etching step that is performed before or after the first masked etching step. This allows the narrow central trenches 170 to be formed at any desired depth that is independent from the depth of the first and second gate trenches 106, 108, e.g., greater or less than 10% of the depth of the first and second gate trenches 106, 108. Consequently, the depth of the monolithic insulating structure 176 can be controlled independently from the depth of the first and second gate trenches 106, 108.

The technique described with reference to FIGS. 3-8 forms a single monolithic insulating structure 176 that completely occupies the lateral region between the first and second semiconductor mesas 134, 142. Alternatively, similar concepts may be used to form multiple monolithic insulating structures 176 between the first and second semiconductor mesas 134, 142, with other structures comprising conductive, insulating, and/or semiconductor material between each of these monolithic insulating structures. In one example of this concept, the mesa dividing structure is provided to include two of the monolithic insulating structures and a central semiconductor mesa laterally disposed between the two monolithic insulating structures. The mesa dividing structure is provided by forming a first plurality of narrow central trenches 170, wherein each of the narrow central trenches 170 in the first plurality are formed to be separated from one another by the intermediary semiconductor mesas 172, according to the dimensional values and relationships described above. Additionally, a second plurality of the narrow central trenches 170 is formed, wherein each of the narrow central trenches 170 in the second plurality are formed to be separated from one another by the intermediary semiconductor mesas 172, according to the dimensional values and relationships described above. The mask is patterned such that a permanent semiconductor mesa that is wider than the intermediary semiconductor mesas 172 is disposed between the first and second pluralities. The insulator growth process is performed such that each of the intermediary semiconductor mesas 172 is completely consumed by the insulator material and such that the permanent semiconductor mesa is only partially consumed with a portion of the permanent semiconductor mesa remaining intact after the insulator growth process.

In other embodiments, one or more trenches may be formed in the semiconductor body between two of the monolithic insulating structures. Alternatively, these trenches, may be formed within one of the monolithic insulating structures. These trenches may be filled with electrical insulators and conductors and may be configured to perform a wide variety of functions that are independent from or in concert with the operation of the vertical IGBT. Various embodiments of the devices will be described in further detail below.

Figure 9:
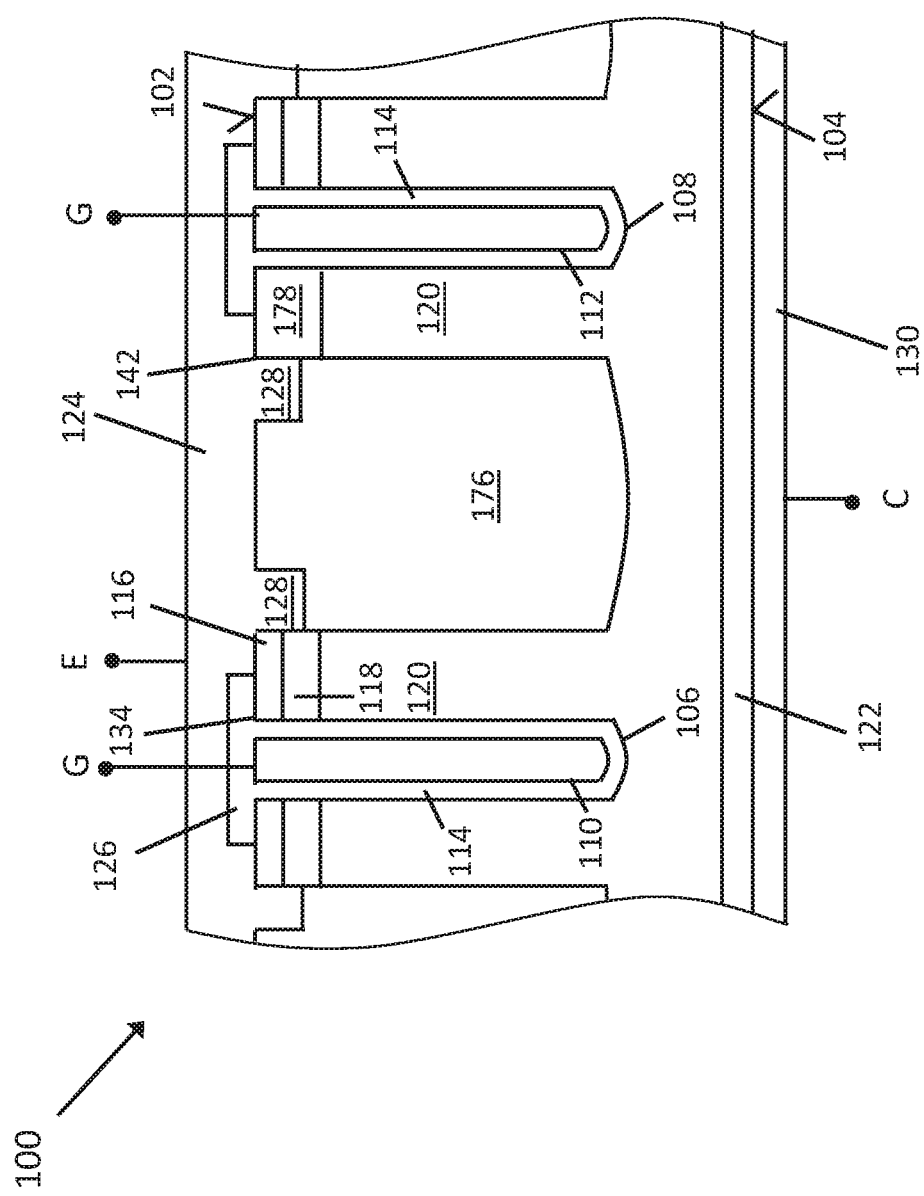
FIG. 9 illustrates a vertical insulated gate bipolar transistor with a mesa dividing structure, according to another embodiment.

Referring to FIG. 9, a vertical IGBT 100 is depicted, according to another embodiment. This device may be identical to the vertical IGBT 100 of FIG. 2 in all respects, except that the second semiconductor mesa 142 is differently configured. In this example, the second semiconductor mesa 142 includes a carrier extraction region 178. The carrier extraction region 178 has the opposite doping type as the source region 116, e.g., the second conductivity type in the case that the source region 116 is a first conductivity type region. The carrier extraction region 178 between the main surface 102 and a p-n junction with the drift region 120 in the second semiconductor mesa 142. Optionally, a contact region with the same conductivity type and higher dopant concentration as the carrier extraction region 178 may be provided in the carrier extraction region 178 to facilitate low-ohmic contact with the emitter contact.

The working principle of the vertical IGBT 100 of FIG. 9 is as follows. The first gate electrode 110 is configured to control the flow of first conductivity type carriers (e.g., electrons) in the first semiconductor mesa 134 in the manner previously described with reference to FIG. 1. During a forward conduction state, the carrier extraction region 178 in the second semiconductor mesa 142 is a reverse biased p-n junction which provides conduction path for second conductivity type carriers (e.g., holes) flowing from the collector region 122 towards the emitter metallization 124. In this way, the second semiconductor mesa 142 provides a conduction path for second conductivity type carriers to be removed from the semiconductor body.

Figure 10:
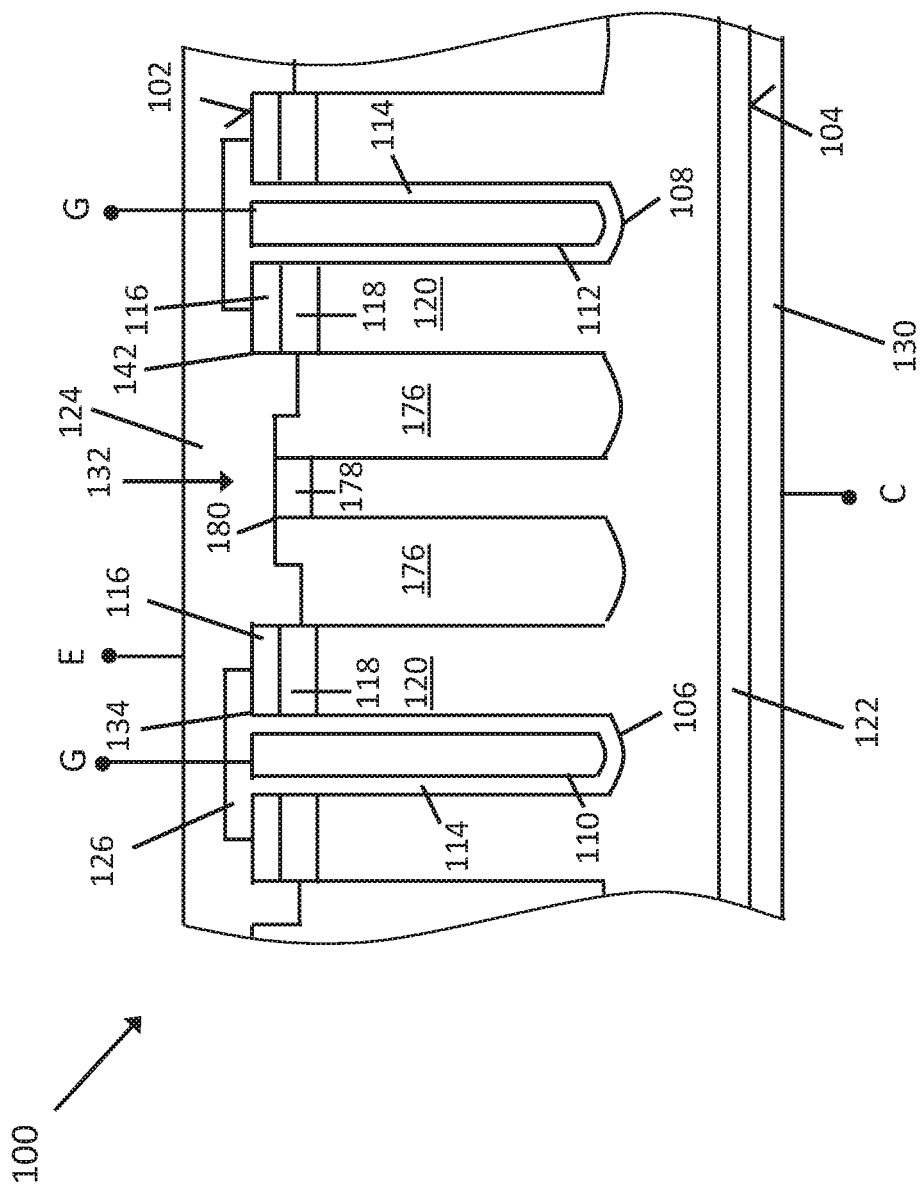
FIG. 10 illustrates a vertical insulated gate bipolar transistor with a mesa dividing structure, according to another embodiment.

Referring to FIG. 10, a vertical IGBT 100 is depicted, according to another embodiment. Like the embodiment of FIG. 9, this device includes a carrier extraction region 178. Different to the previous embodiments, the mesa dividing structure 132 includes two of the monolithic insulating structures 176 and a central semiconductor mesa 180 between the two monolithic insulating structures 176. This configuration may be obtained according to techniques previously described. The first and second semiconductor mesas 134, 142 are disposed on either side of the two monolithic insulating structures 176 and are configured in a similar manner as previously described. The carrier extraction region 178 is provided in the central semiconductor mesa and is configured to provide a return path for second conductivity type carriers in a similar manner as previously described. In another embodiment, the device may be configured such that the emitter metallization 124 only contacts the source regions 116 in the first and second semiconductor mesas 134, 142. In that case, second conductivity type carrier extraction occurs exclusively at the carrier extraction region 178.

Figure 11:
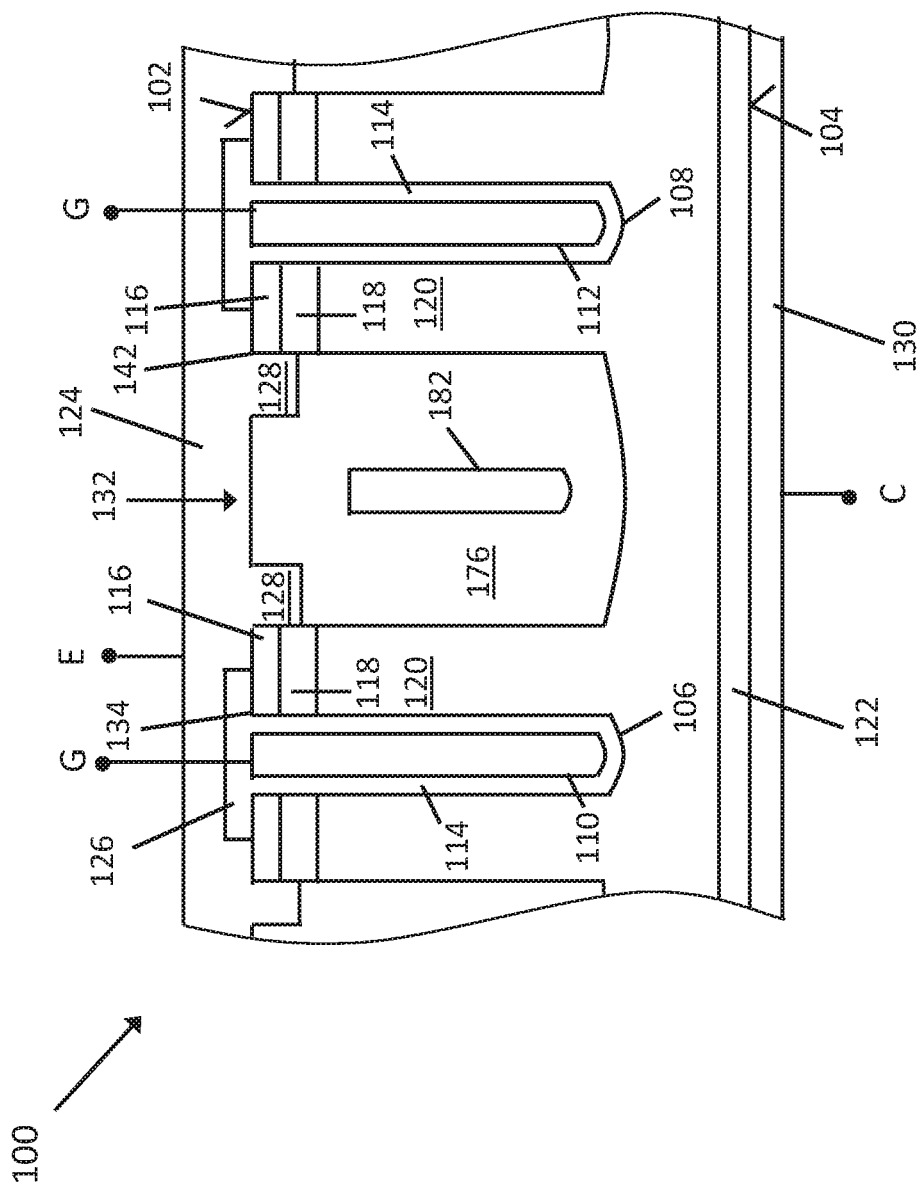
FIG. 11 illustrates a vertical insulated gate bipolar transistor with a mesa dividing structure, according to another embodiment.

Referring to FIG. 11, a vertical IGBT 100 is depicted, according to another embodiment. This device may be identical to the vertical IGBT 100 of FIG. 2 in all respects, except that the mesa dividing structure 132 includes both electrically insulating material and electrically conductive material. The electrically insulating material may be provided by forming one of the monolithic insulating structures 176 according to the technique previously described. An electrically conductive region 182 is formed in a central region of the mesa dividing structure 132 that is insulated from the semiconductor body by the insulator material of the monolithic insulating structures 176. The electrically conductive region 182 can include metals such as tungsten, aluminum, copper, etc. and alloys thereof, or highly doped polycrystalline semiconductor material.

The electrically conductive region 182 can be formed in several different ways. In one example, the technique described with reference to FIG. 4 is performed such that a wider trench is provided between the narrow central trenches 170. This wider trench is not completely filled during the insulator formation process described with reference to FIG. 5. A conductive material, e.g., polysilicon is then deposited in this wider trench. Alternatively, after performing the process described with reference to FIG. 5, the electrically conductive region 182 may be formed by etching a trench in the monolithic insulating structures 176 and depositing an electrical conductor, e.g., polysilicon in this trench. In yet another example, a similar etching and deposition step may be performed after forming the first and second gate electrodes 110, 122.

After forming a plurality of the narrow central trenches 170 according to the technique described with reference to FIG. 4, one of the narrow trenches is filled with the electrically conductive material, e.g., using a deposition technique. Subsequently, the insulator growth process is performed in a similar manner as described with reference to FIG. 5.

Generally speaking, the electrically conductive region 182 can be configured to serve a variety of device functions. In one example, the electrically conductive region 182 is configured to be electrically floating, i.e., electrically disconnected from all nodes and terminals of the device. In that case, the electrically conductive region 182 may be configured as a shielding structure which prevents cross-coupling between two devices. In another example, the electrically conductive region 182 can be configured as a passive element that is connected to the vertical IGBT 100. For example, the electrically conductive region 182 can be configured as a resistor. The resistance value of this resistor can be selected by tailoring the physical properties of the conductive region, e.g., length, width, cross-sectional area, etc. This resistor can be connected to the gate electrodes 112 by a connection (not shown) so as to add gate resistance to the vertical IGBT 100. In another example, the resistor may be configured as a functional element that operates independently from the vertical IGBT 100. For example, the resistor can be configured as a temperature sensor.

If desired, the thickness of the insulator material between the electrically conductive region 182 and the first and/or second semiconductor mesas 134, 142 can be controlled such that the conductive region does not substantially influence the flow of carriers in the first and/or second semiconductor mesas 134, 142. This means that electromagnetic fields generated from charges flowing in the electrically conductive region 182 are sufficiently mitigated such that they do not influence charges present in the first and/or second semiconductor mesas 134, 142.

Figure 12:
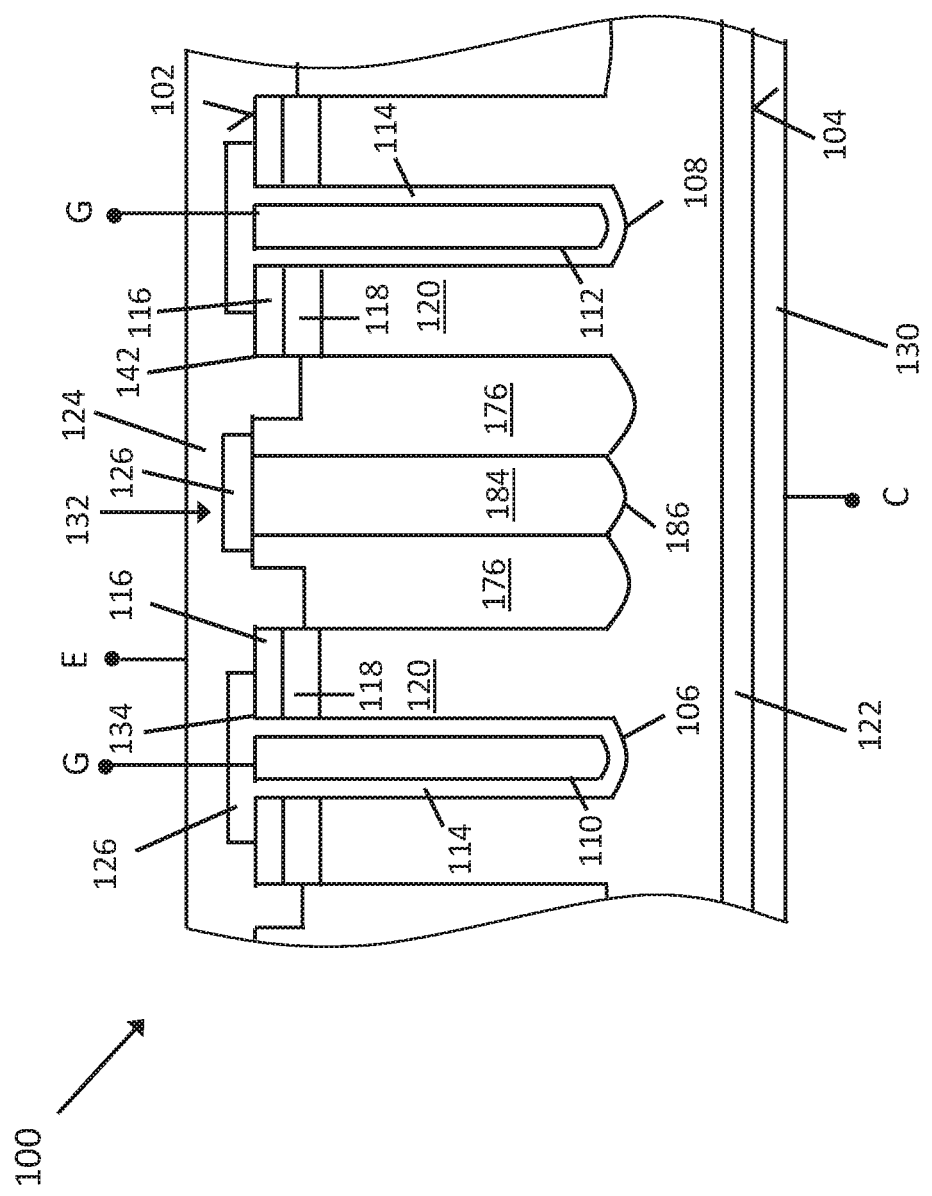
FIG. 12 illustrates a vertical insulated gate bipolar transistor with a mesa dividing structure, according to another embodiment.

Referring to FIG. 12, a vertical IGBT 100 is depicted, according to another embodiment. Similar to the previously discussed embodiment, the mesa dividing structure 132 includes both electrically insulating material and electrically conductive material. However, in this case, the electrically conductive material is provided by a polysilicon region 184 that is disposed in a central trench 186. This configuration may be obtained by forming the central trench 186 in between the first and second gate trenches 106, 108, wherein the central trench 186 may have similar or identical dimensions as the first and second gate trenches 106, 108. A plurality of the narrow central trenches 170 and intermediary semiconductor mesas 172 may be provided on either side of the central trench 186, and subsequently filled and replaced with insulating material to form the monolithic insulating structures 176 according to the previously described techniques. In this case, the process is controlled so that the monolithic insulating structures 176 reach the sidewalls of the central trench 186. Subsequently, a polysilicon layer is deposited which fills the central trench 186 and forms the polysilicon region 184. In this technique, undoped or slightly doped polysilicon may be deposited in the first and second gate trenches 106, 108 and the central trench 186 simultaneously. The central trench 186 may be completely or partially masked during the doping of the gate trenches. Alternatively, doped polysilicon may be deposited in the first and second gate trenches 106, 108 and the central trench 186 simultaneously. Subsequently, this doped polysilicon is removed completely or partially from the central trench 186. A second polysilicon layer is then deposited to fill the central trench 186. A planarization step may be employed to remove both polysilicon layers form outside of the trenches.

The polysilicon region 184 of the embodiment of FIG. 12 may be configured to serve a variety of device functions. These device functions include any of the configurations of the electrically conductive region 182 as described with reference to FIG. 10. In another example, the polysilicon region 184 can be configured as a p-n junction diode. This p-n junction diode may be configured as a temperature sensing diode, for example. In one arrangement, the polysilicon region 184 includes a first conductivity type region (e.g., n-type) in the bottom of the central trench 186, and a second conductivity type region (e.g., p-type) in the top of the central trench 186. As a result, the polysilicon region 184 includes a p-n junction that extends along a plane that is about parallel to the main surface 102. In another arrangement, the polysilicon region 184 includes a first conductivity type region (e.g., n-type) that completely fills a first lateral section of the central trench 186, and a second conductivity type region (e.g., p-type) that completely fills a second lateral section of the central trench 186 that is behind the first lateral section in a length direction of the trench. As a result, the polysilicon region 184 includes a p-n junction that extends along a plane that is about perpendicular to the main surface 102. In either case, electrical connections to the various doped polysilicon may be effectuated through known techniques.

Figure 13:
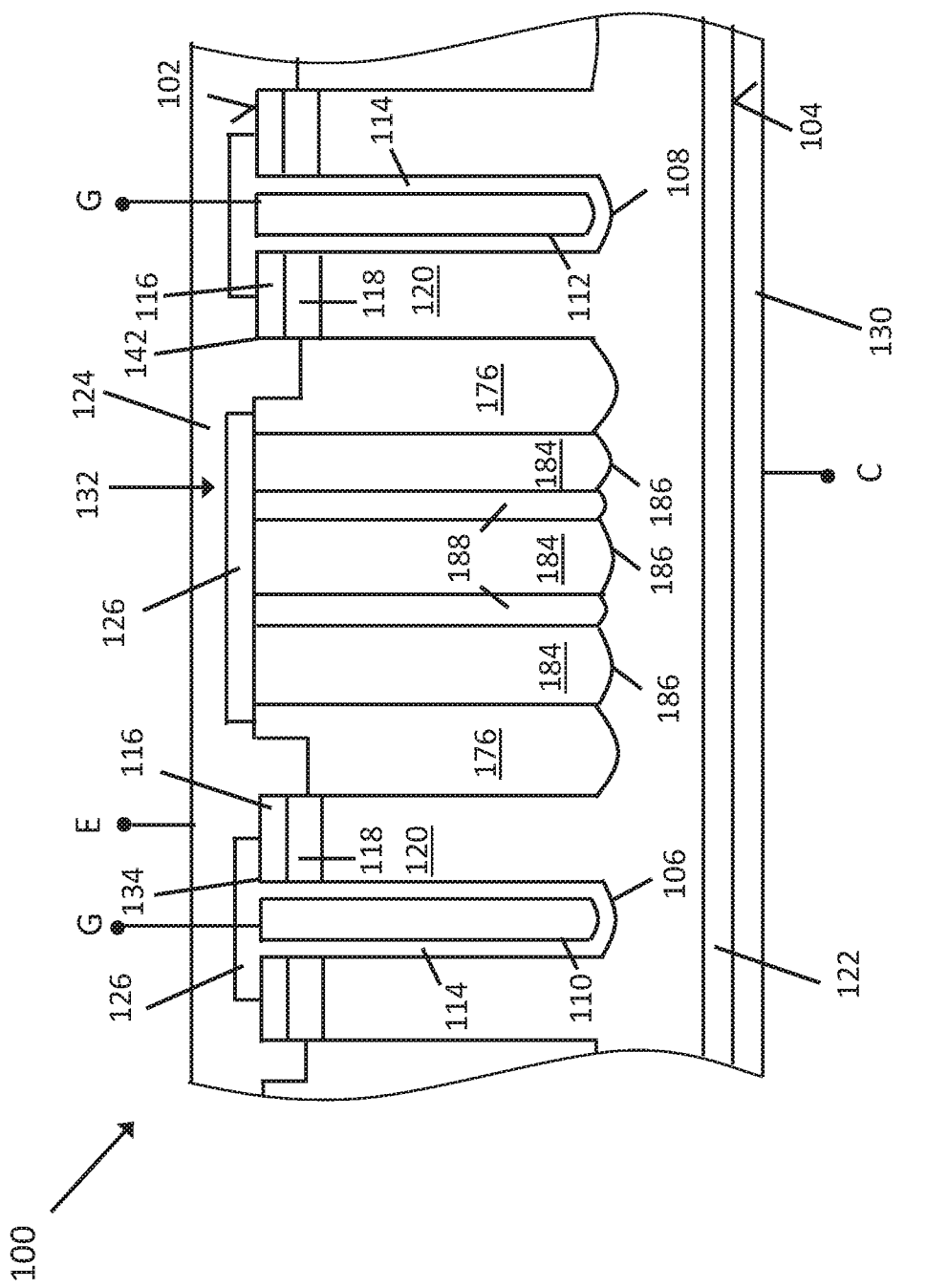
FIG. 13 illustrates a vertical insulated gate bipolar transistor with a mesa dividing structure, according to another embodiment.

Referring to FIG. 13, a vertical IGBT 100 is depicted, according to another embodiment. This device may be identical to the vertical IGBT 100 of FIG. 12 in all respects, except that it includes more than one of the central trenches 186, with a polysilicon region 184 provided in each one. This structure may be formed according to the same technique as described with reference to FIG. 12, wherein multiple ones of the central trenches 186 are formed adjacent to one another and separated by a semiconductor mesa of similar or identical width to the intermediary semiconductor mesas 172 as previously described.

The polysilicon regions 184 in the central trenches 186 can be configured to serve a variety of device functions, including any device functions described with reference to FIGS. 11 and 12. In one example, each of the polysilicon regions 184 are configured as series connected resistors, wherein the multi-trench configuration provides greater resistance values per unit area. Alternatively, the polysilicon regions 184 in the central trenches 186 can be configured differently. For example, a central one of the polysilicon regions 184 can be connected to gate or source potential, e.g., to add resistance or capacitance, and the outer polysilicon regions 184 can be electrically floating so as to provide electrical shielding.

Figure 14:
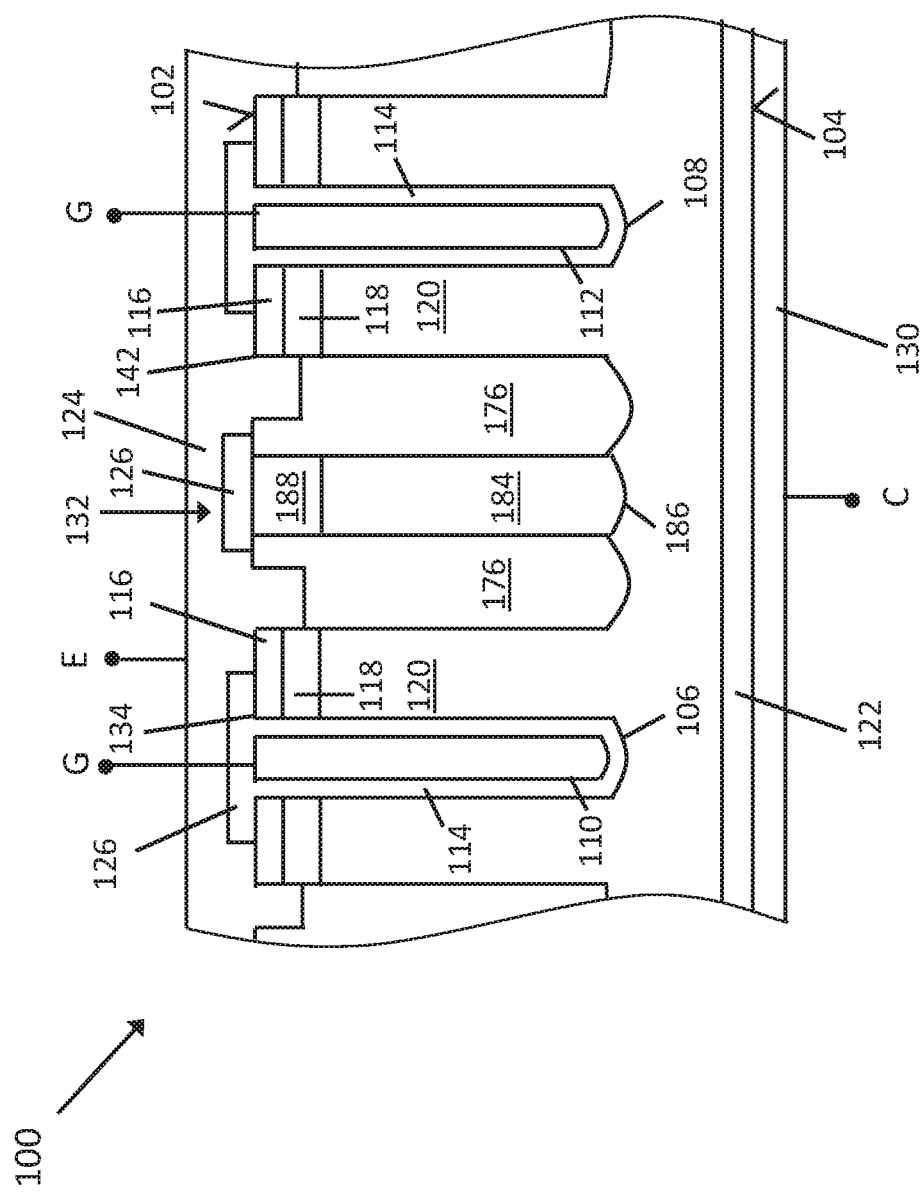
FIG. 14 illustrates a vertical insulated gate bipolar transistor with a mesa dividing structure, according to another embodiment.

Referring to FIG. 14, a vertical IGBT 100 is depicted, according to another embodiment. This device may be identical to the vertical IGBT 100 of FIG. 12 in all respects, except that two different polysilicon regions are provided in the central trench 186. These polysilicon regions are formed at different processing stages. The polysilicon region 184 in the lower region of the central trench 186 is formed concurrently with the polysilicon that forms the gate electrodes 110, 112. The polysilicon region 188 in the upper region of the central trench 186 is formed following a partial removal of the gate polysilicon. A planarization step may be employed to remove both polysilicon layers form outside of the trenches. This technique represents one way to form a p-n junction in the central trench 186 with fewer processing steps than the technique described with reference to FIG. 12.

Figure 15:
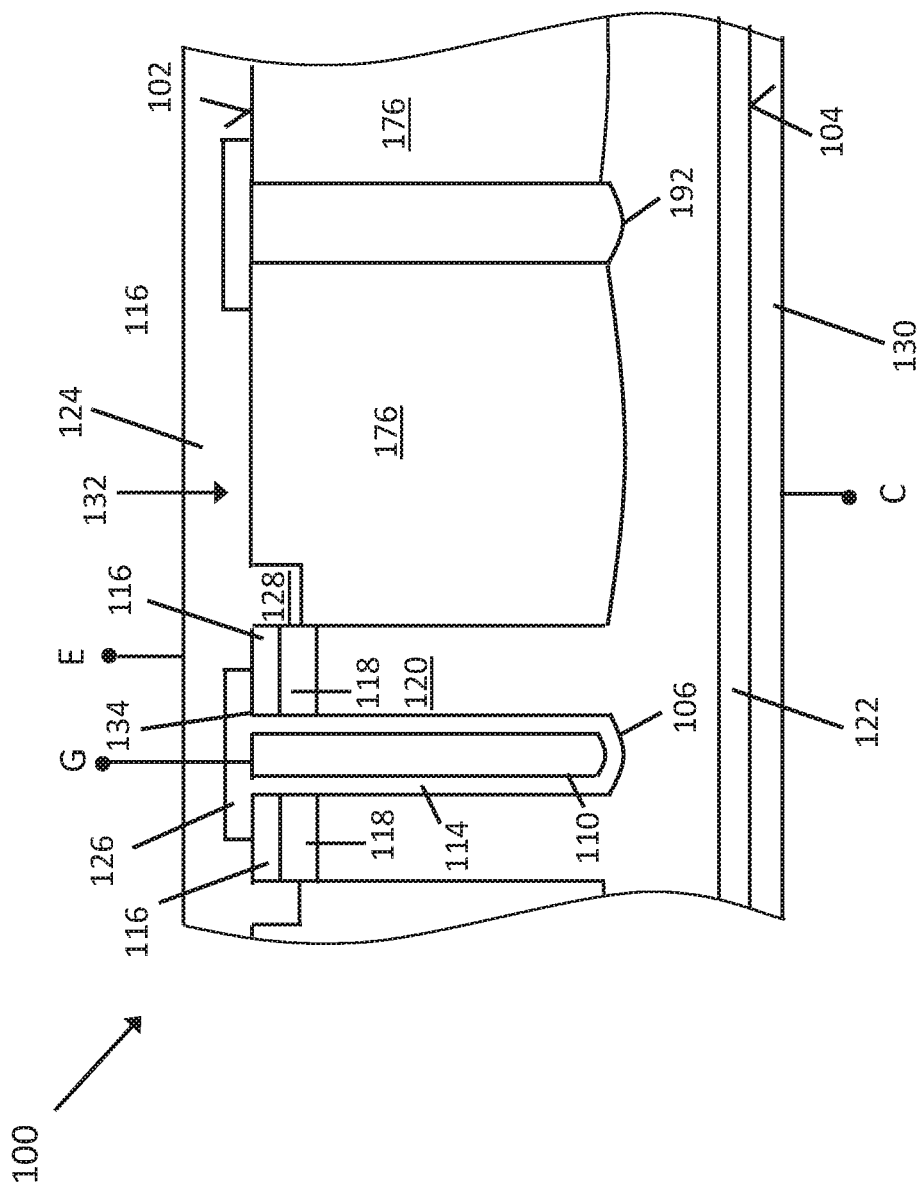
FIG. 15 illustrates a vertical insulated gate bipolar transistor with a mesa dividing structure, according to another embodiment.

Referring to FIG. 15, a vertical IGBT 100 is depicted, according to another embodiment. This device may be identical to the vertical IGBT 100 of FIG. 2 in all respects, except that the mesa dividing structure 132 includes two of the monolithic insulating structures 176 with a secondary trench 192 disposed in between them. The monolithic insulating structures 176 are formed to directly interface with the secondary trench 192. One of the monolithic insulating structures 176 completely occupies a lateral region between the first semiconductor mesa 134 and the secondary trench 192. On the opposite side of the secondary trench 192, another one of the monolithic insulating structures 176 extends completely to reach another semiconductor mesa (not shown). This pattern is repeated successively such that gate trenches are alternatingly disposed between the secondary trenches 192. Semiconductor mesas are provided on either side of each gate trench and configured as vertical IGBT structures according to the operation principle previously described.

The device of FIG. 15 may be formed using the technique described with reference to FIGS. 3-8, wherein the secondary trench 192 may be formed with the same spacing and width as the second gate trench 108 as previously described. Different to the technique described in FIGS. 3-5, the narrow central trenches 170 are formed sufficiently close to the secondary trench 192 such that that the insulator material reaches the sidewall of the secondary trench 192 during the insulator growth process. The secondary trench 192 may be filled with electrically conductive metal or polysilicon according to the previously described techniques and may be configured to provide any of the functions as the polysilicon region 184 or electrically conductive region 182 as previously described.

Figure 16:
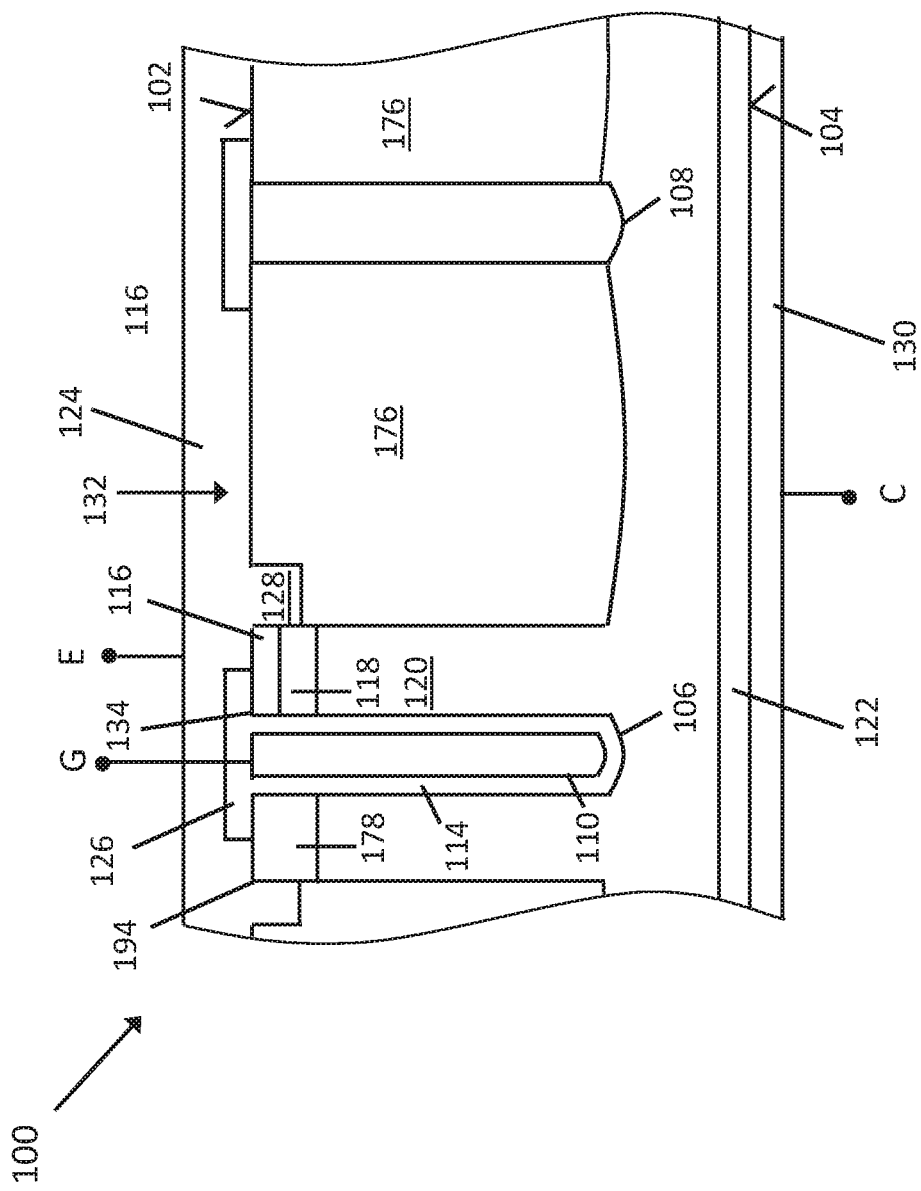
FIG. 16 illustrates a vertical insulated gate bipolar transistor with a mesa dividing structure, according to another embodiment.

Referring to FIG. 16, a vertical IGBT 100 is depicted, according to another embodiment. This device may be identical to the vertical IGBT 100 of FIG. 2 in all respects, except that a third semiconductor mesa 194 on the opposite side of the first gate trench 106 includes a carrier extraction region 178 instead of the emitter and body region 118, 120. The carrier extraction region 178 is configured to provide a conduction path for second conductivity type carriers (e.g., holes) in the manner previously described with reference to FIG. 9. This basic cell configuration may be repeated successively such that every other gate trench includes a semiconductor mesa with vertical IGBT region on one side and a semiconductor mesa with a carrier extraction region 178 on another side.

Figure 17:
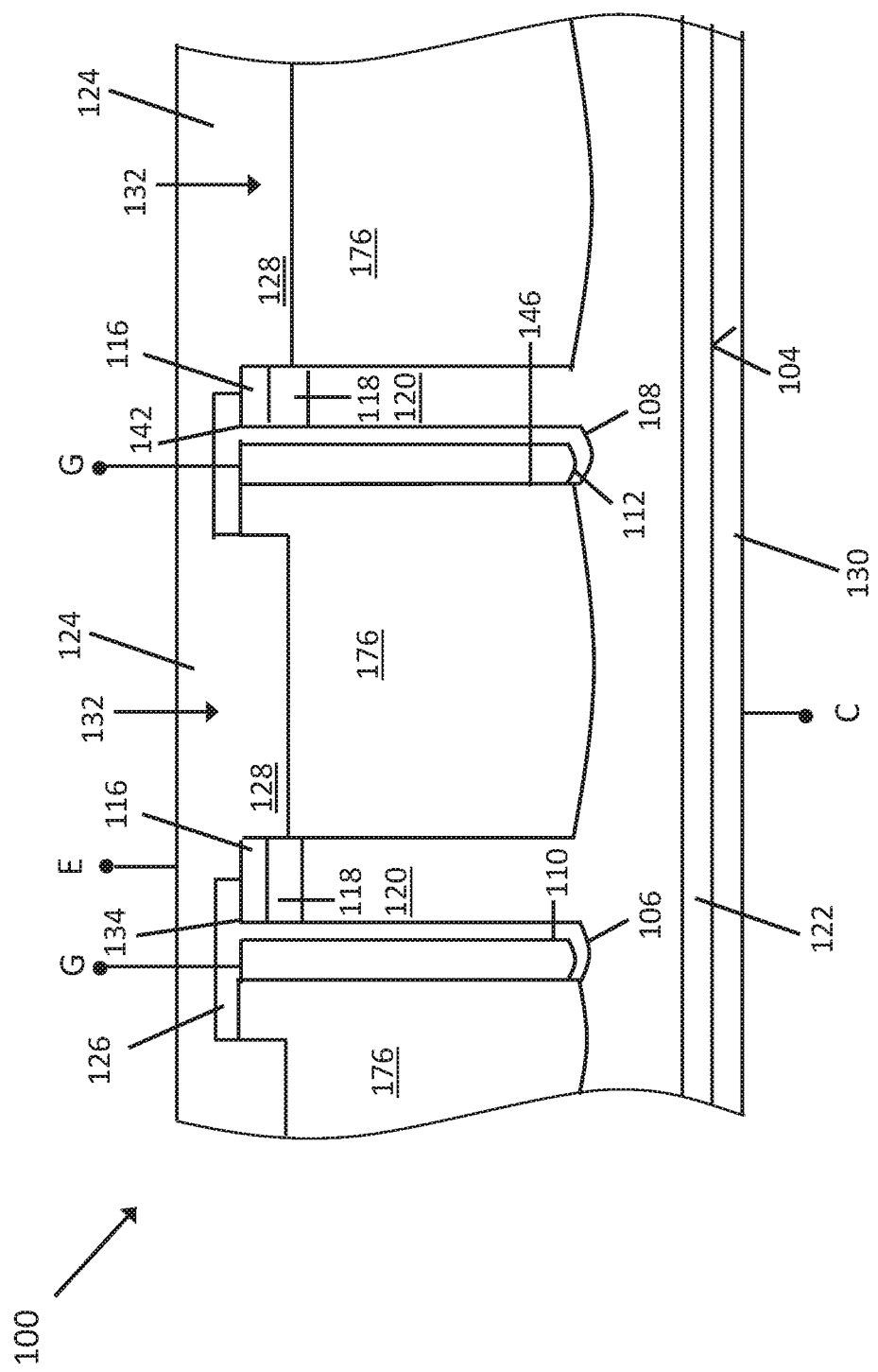
FIG. 17 illustrates a vertical insulated gate bipolar transistor with a mesa dividing structure, according to another embodiment

Referring to FIG. 17, a vertical IGBT 100 is depicted, according to another embodiment. This device may be identical to the vertical IGBT 100 of FIG. 2 in all respects, except that the mesa dividing structure 132 has a sidewall that is coextensive with a first sidewall 146 of the second gate trench 108. One advantage of this device is that it allows for large contact holes to reach planarized polysilicon within the gate trenches 106, 108. These contact holes may overlap with the adjacent mesa dividing structure 132. As a result, simpler less costly processing steps may be performed to contact the gate polysilicon. Alternatively, in devices wherein the polysilicon filling the gate trenches 106, 108 is not planarized, the mesa dividing structure 132 provides a region for polysilicon to laterally extend over and cover the mesa dividing structure 132. The contribution of the polysilicon outside of the gate trenches to gate-collector capacitance is maintained low, due to the presence of the mesa dividing structure 132 underneath the polysilicon.

The device of FIG. 17 may be formed using the technique described with reference to FIGS. 3-8, wherein the semiconductor mesa between the second trench 108 and its closest narrow central trench 170 is narrow enough so that it is completely consumed during the formation of the insulator layer 174.

The vertical IGBT 100 discussed herein represents just one example of a wide variety of device types to which the presently disclosed techniques are applicable. For example, other types of vertical power semiconductor devices, such as diodes, insulated gate bipolar transistors thyristors, MOSFETS etc., may similarly include high aspect ratio mesa structures having the appropriate active devices regions, e.g., source, body, anode, etc. In one specific example, each of the vertical IGBTs 100 described herein may alternatively be configured as a MOSFET device by omitting the collector region.

The present specification refers to a "first" and a "second" conductivity type of dopants. These terms refer to the majority carrier type of doped semiconductor regions. The first conductivity type may be n-type and the second conductivity type may be p-type (or vice versa). In any of the embodiments described herein, the doping types may be reversed to obtain a device that operates on a similar working principle. For example, an n-channel device may be converted to a p-channel device by changing the first conductivity type regions to second conductivity type regions, and vice-versa. The present specification encompasses all such embodiments.

As used herein "minimum trench separation distance" refers to a process specific design rule which defines how closely two trenches can nominally be laterally spaced apart from one another. In the semiconductor arts, design rules are commonly used to ensure acceptable yield. Design rules exist because techniques for forming semiconductor features, e.g., mask lithography, etching, etc., have inherent and unavoidable variability. Moreover, after semiconductor features are formed, subsequent processing steps (e.g., high temperature steps, contact formation, back end of the line processing, etc.) may cause further changes and variation in geometry of the formed features. As a result, the precise geometry of any one feature to be formed can only be predicted within a statistical distribution of outcomes. Specifically with respect to trench formation, photolithography techniques and the subsequent etching of semiconductor material each introduce variability into the process such that the precise dimensions of the trenches to be formed (e.g., length, width, depth, etc.) can only be predicted within a certain range of statistical distribution. This variation may be compounded by further processing steps, e.g., annealing, doping, etc. Moreover, trench minimum separation distance may be limited by the minimum sizes of superjacent structures such as contact holes and/or metallization that are used to form electrical connections with conductive regions within the trenches. The "minimum trench separation distance" as used herein accounts for this variation by defining the required spacing between two trenches to ensure that, within the outer ranges of statistical variation in trench geometry as between two adjacent trenches (e.g., 3Q), these trenches are sufficiently spaced apart from one another to prevent device failure.

As used herein, the term "about" encompasses absolute conformity with a requirement as well as minor deviation from absolute conformity with the requirement due to manufacturing process variations. Provided that the deviation is within an acceptable process window and the components described herein can function according to the application requirements, the term "about" encompasses any of the values within these deviations.

In this specification, the "first conductivity type" and the "second conductivity type" refer to majority dopant concentrations of semiconductor material, which may be either n-doped or p-doped. The first conductivity type and second conductivity type are opposite conductivity types such that the first conductivity type may refer to n-type doping, wherein the second conductivity type refers to p-type doping, or vice-versa.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of producing a semiconductor device, the method comprising:
   providing a semiconductor substrate comprising a main surface and rear surface opposite the main surface;
   providing first and second trenches that are laterally separated from one another and each extend from the main surface into the substrate;
   providing a mesa dividing structure that is laterally between the first and second trenches and comprises non-semiconductor material;
   providing a first semiconductor mesa between the first trench and the mesa dividing structure, the first semiconductor mesa comprising:
   a first sidewall that is coextensive with a first sidewall of the first trench;
   a second sidewall that directly interfaces with the non-semiconductor material of the mesa dividing structure;
   a source region extending to the main surface and having a first conductivity type;
   a body region that is below the source region and has a second conductivity type opposite from the first conductivity type; and
   a drift region that is below body region and has the first conductivity type; and
   wherein the first and second trenches are initially formed by a masked etching technique at a first trench separation distance from one another and
   wherein the first semiconductor mesa is provided to have a lateral width that is less than the first trench separation distance, the lateral width of the first semiconductor mesa being a shortest distance between the first and second sidewalls of the first semiconductor mesa,
   wherein providing the mesa dividing structure comprises:
   forming at least one central trench that is between the first and second trenches and is laterally separated from the first trench;
   performing an insulator growth process that fills the central trench with insulator material and consumes semiconductor material; and
   controlling parameters of the insulator growth process so that the insulator material consumes semiconductor material between the central trench and the first trench to further narrow the first semiconductor mesa.

2. The method of claim 1, wherein providing the mesa dividing structure comprises:
   forming a plurality of the central trenches between the first and second trenches, each of the central trenches having a width that is less than widths of the first and second trenches; and
   performing the insulator growth process such that each of the central trenches is completely filled with the insulator material.

3. The method of claim 2, wherein the plurality of the central trenches are formed to be separated from one another by intermediary semiconductor mesas, and wherein the insulator growth process is performed such that each of the intermediary semiconductor mesas is completely consumed by the insulator material so as to form a monolithic insulating structure from the plurality of the central trenches.

4. The method of claim 3, further comprising forming a secondary trench disposed between the first and second trenches, and wherein the monolithic insulating structure is formed to completely occupy a lateral region between the first semiconductor mesa and the secondary trench.

5. The method of claim 4, further comprising forming a first gate electrode in the first gate trench, a second gate electrode in the second gate trench, and a conductive region in the secondary trench, wherein forming the first and second gate electrodes and the conductive region comprises:
   depositing a first doped polysilicon layer that fills the first and second gate trenches and the secondary trench simultaneously with doped polysilicon;
   removing the doped polysilicon from the secondary trench;
   depositing a second undoped polysilicon layer in the secondary trench after removing the doped polysilicon from the secondary trench;
   planarizing the substrate so as to remove portions of the first and second polysilicon layers above the first and second gate trenches and the secondary trench.

6. The method of claim 3, further comprising:
   forming a contact trench in the monolithic insulating structure; and
   filing the contact trench with an electrically conductive material thereby forming an emitter contact;
   wherein a sidewall of the emitter contact directly interfaces with the emitter and body regions.

7. The method of claim 3, wherein the mesa dividing structure is provided to include two of the monolithic insulating structures and a central semiconductor mesa laterally disposed between the two monolithic insulating structures, and wherein providing the mesa dividing structure comprises:
   providing a first plurality of the central trenches, wherein each of the central trenches in the first plurality are formed to be separated from one another by the intermediary semiconductor mesas;
   providing a second plurality of the central trenches, wherein each of the central trenches in the second plurality are formed to be separated from one another by the intermediary semiconductor mesas;

providing a permanent semiconductor mesa between the first and second pluralities, the permanent semiconductor mesa being wider than the intermediary semiconductor mesas; and performing the insulator growth process such that each of the intermediary semiconductor mesas is completely consumed by the insulator material and such that the permanent semiconductor mesa remains at least partially intact after the insulator growth process.

8. The method of claim 2, wherein the first and second trenches and the plurality of the central trenches are formed simultaneously by the masked etching technique.

9. The method of claim 2, wherein the first and second trenches are formed by a first masked etching step, wherein the plurality of the central trenches are formed by a second masked etching step that is performed before or after the first masked etching step, and wherein the central trenches are formed at different depths as the first and second trenches.

10. The method of claim 1, wherein the first semiconductor mesa is provided such that an aspect ratio of the first semiconductor mesa is less than or equal to 0.2, wherein the aspect ratio of the first semiconductor mesa is a lateral width of the first semiconductor mesa divided by a vertical depth of the first semiconductor mesa.

* * * * *